(12) United States Patent
Fujinami et al.

(10) Patent No.: US 9,202,563 B2
(45) Date of Patent: Dec. 1, 2015

(54) STORAGE CONTROLLING APPARATUS, STORAGE APPARATUS AND PROCESSING METHOD

(71) Applicant: Sony Corporation, Tokyo (JP)

(72) Inventors: Yasushi Fujinami, Tokyo (JP); Naohiro Adachi, Tokyo (JP); Ken Ishii, Tokyo (JP); Hideaki Okubo, Saitama (JP); Keiichi Tsutsui, Kanagawa (JP); Kenichi Nakanishi, Tokyo (JP); Tatsuo Shinbashi, Tokyo (JP)

(73) Assignee: Sony Corporation, Tokyo (JP)

( * ) Notice: Subject to any disclaimer, the term of this patent is extended or adjusted under 35 U.S.C. 154(b) by 422 days.

(21) Appl. No.: 13/855,155

(22) Filed: Apr. 2, 2013

(65) Prior Publication Data

US 2013/0290620 A1    Oct. 31, 2013

(30) Foreign Application Priority Data

Apr. 25, 2012    (JP) ................................. 2012-099330

(51) Int. Cl.
*G11C 13/00*    (2006.01)
*G11C 7/10*    (2006.01)
*G11C 7/22*    (2006.01)

(52) U.S. Cl.
CPC ............ *G11C 13/004* (2013.01); *G11C 7/1072* (2013.01); *G11C 7/22* (2013.01); *G11C 13/0007* (2013.01); *G11C 13/0023* (2013.01); *G11C 13/0061* (2013.01); *G11C 13/0069* (2013.01); *G11C 13/0097* (2013.01); *G11C 2213/79* (2013.01)

(58) Field of Classification Search
CPC ............ G11C 7/1072; G11C 13/0069; G11C 13/0061; G11C 13/0023; G11C 13/0007; G11C 13/0097; G11C 13/004; G11C 7/22; G11C 2213/79
See application file for complete search history.

(56) References Cited

FOREIGN PATENT DOCUMENTS

JP    2010-140526 A    6/2010

*Primary Examiner* — Harry W Byrne
*Assistant Examiner* — Ajay Ojha
(74) *Attorney, Agent, or Firm* — Michael Best & Friedrich LLP

(57) ABSTRACT

A storage controlling apparatus includes a command decoder and command processing section. The command decoder decides whether or not a plurality of access object addresses of different commands included in a command string correspond to words different from each other in a same one of blocks of a memory cell array which have a common plate. The command processing section collectively and successively executes, when it is decided that the access object addresses of the commands correspond to the words different from each other in the same block of the memory cell array, those of operations in processing of the commands in which an equal voltage is applied as a drive voltage between the plate and a bit line.

12 Claims, 23 Drawing Sheets

F I G . 1
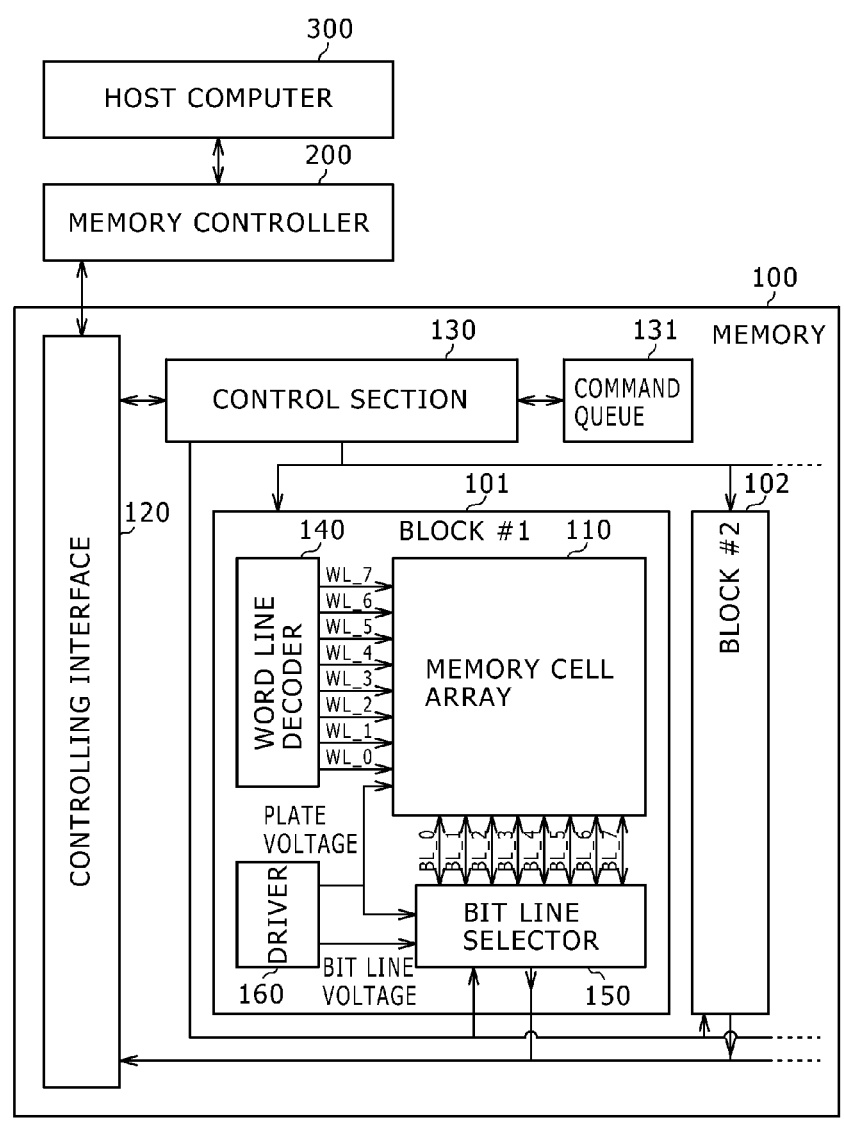

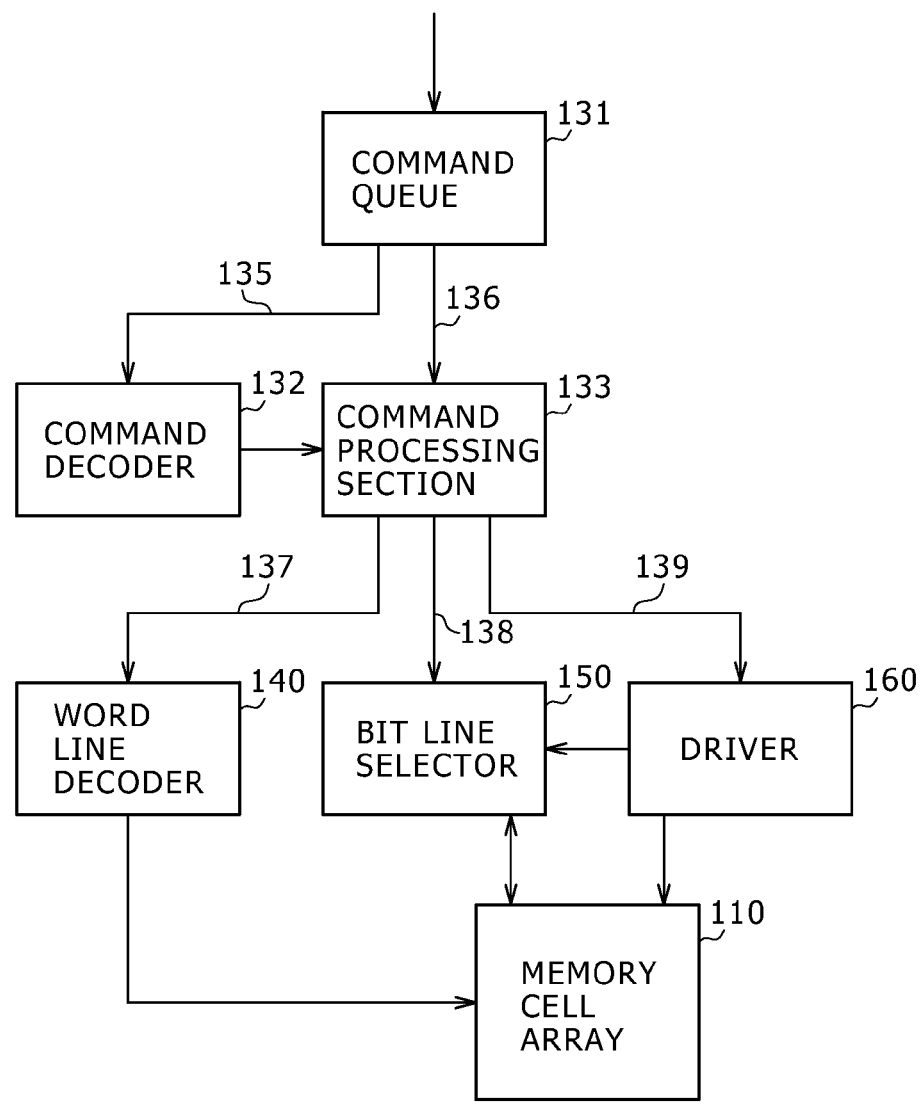

STORAGE CONTROLLING APPARATUS, STORAGE APPARATUS AND PROCESSING METHOD

BACKGROUND

The present technology relates to a storage controlling apparatus. More particularly, the present technology relates to a storage controlling apparatus, a storage apparatus and an information processing system for a nonvolatile memory and a processing method for the storage controlling apparatus, storage apparatus and information processing system as well as a program for causing a computer to execute the processing method.

In an information processing system, a DRAM (Dynamic Random Access Memory) or a like device is used as a work memory. The DRAM normally is a volatile memory, and if supply of power thereto stops, then the stored contents thereof are lost. On the hand, in recent years, nonvolatile memories (NVM) have been used. Such nonvolatile memories are roughly divided into flash memories ready for data accessing in a unit of a large size and nonvolatile random access memories (NVRAM: Non-Volatile RAM) which allow high speed random access thereto in a small unit. A representative one of the flash memories is a NAND type flash memory. Meanwhile, the nonvolatile random access memories include a ReRAM (Resistance RAM), a PCRAM (Phase-Change RAM), an MRAM (Magnetoresistive RAM) and so forth.

Among the nonvolatile random access memories, the ReRAM is a resistance change memory which uses a variable resistive element. The variable resistive element of the ReRAM can record information of one bit in two states including a high resistive state (HRS) and a low resistive state (LRS). To the ReRAM, it is necessary to apply drive voltages of different potentials depending upon whether the variable resistive element is to be changed into the high resistive state or the variable resistive element is to be changed into the low resistive state. This is described, for example, in Japanese Patent Laid-Open No. 2010-140526.

SUMMARY

As described above, in order to change the state of the variable resistive element of the ReRAM, it is necessary to apply a drive voltage of a different potential in response to the resistive state. Further, since the ReRAM has a structure wherein a large number of memory cells are connected to a common plate, it has a very great storage capacity. Therefore, the ReRAM has a problem in that, if drive voltages of different potentials are applied thereto repetitively, then upon charging and discharging upon such voltage applications, high electric power is consumed.

Therefore, it is desirable to suppress generation of charging and discharging in a resistance change memory to reduce power consumption.

According to a first embodiment of the present technology, there is provided a storage controlling apparatus including a command decoder configured to decide whether or not a plurality of access object addresses of different commands included in a command string correspond to words different from each other in a same one of blocks of a memory cell array which have a common plate, and a command processing section configured to collectively and successively execute, when it is decided that the access object addresses of the commands correspond to the words different from each other in the same block of the memory cell array, those of operations in processing of the commands in which an equal voltage is applied as a drive voltage between the plate and a bit line. According to the first embodiment of the present technology, also there is further provided a storage controlling method including deciding whether or not a plurality of access object addresses of different commands included in a command string correspond to words different from each other in a same one of blocks of a memory cell array which have a common plate, and collectively and successively executing, when it is decided that the access object addresses of the commands correspond to words different from each other in the same block of the memory cell array, those of operations in processing of the commands in which an equal voltage is applied as a drive voltage between the plate and a bit line. In the storage controlling apparatus and the storage controlling method, those of operations in processing of a plurality of commands in which an equal voltage is applied as the drive voltage are executed collectively and successively.

The storage controlling apparatus may be configured such that the command decoder further decides whether or not the commands are two read commands, and the command processing section collectively and successively executes, when it is decided that the access object addresses of the two read commands correspond to the words different from each other in the same block of the memory cell array, those of operations in processing of the two read commands in which a read drive voltage is applied as the drive voltage. In the storage controlling apparatus, those of operations in processing of two read commands in which an equal voltage is applied as the drive voltage are executed collectively and successively.

The storage controlling apparatus may be configured such that the command decoder further decides whether or not the commands are two write commands, and the command processing section collectively and successively executes, when it is decided that the access object addresses of the two write commands correspond to the words different from each other in the same block of the memory cell array, those of operations in processing of the two write commands in which a read drive voltage is applied as the drive voltage, collectively and successively executes those operations in which a set drive voltage is applied as the drive voltage, and collectively and successively executes those operations in which a reset drive voltage is applied as the drive voltage. In the storage controlling apparatus, those of operations in processing of two write commands in which an equal voltage is applied as the drive voltage are executed collectively and successively.

The storage controlling apparatus may be configured such that the command decoder further decides whether or not the commands are a combination of one read command and one write command, and the command processing section collectively and successively executes, when it is decided that the access object addresses of the read command and the write command correspond to words different from each other in the same block of the memory cell array, those of operations in processing of the read command and the write command in which a read drive voltage is applied as the drive voltage. In the storage controlling apparatus, those of operations in processing of a write command and a read command in which an equal voltage is applied as the drive voltage are executed collectively and successively.

The storage controlling apparatus may be configured such that the command decoder further decides whether or not the commands are two erasure commands, and the command processing section collectively and successively executes, when the access object addresses of the two erasure commands correspond to words different from each other in the same block of the memory cell array, those of operations in processing of the two erasure commands in which a read drive voltage is applied as the drive voltage, and collectively and successively executes those operations in which a set drive voltage is applied as the drive voltage. In the storage controlling apparatus, those of operations in processing of two erasure commands in which an equal voltage is applied as the drive voltage are executed collectively and successively.

The storage controlling apparatus may be configured such that the command decoder further decides whether or not the commands are two program commands, and the command processing section collectively and successively executes, when it is decided that the access object addresses of the two program commands correspond to words different from each other in the same block of the memory cell array, those of operations in processing of the two program commands in which a read drive voltage is applied as the drive voltage, and collectively and successively executes those operations in which a reset drive voltage is applied as the drive voltage. In the storage controlling apparatus, those of operations in processing of two program commands in which an equal voltage is applied as the drive voltage are executed collectively and successively.

The storage controlling apparatus may be configured such that the command decoder further decides whether or not the commands are a combination of one read command and one erasure command, and the command processing section collectively and successively executes, when it is decided that the access object addresses of the read command and the erasure command correspond to words different from each other in the same block of the memory cell array, those of operations of processing of the read command and the erasure command in which a read drive voltage is applied as the drive voltage from among operations. In the storage controlling apparatus, those of operations in processing of a read command and an erasure command in which an equal voltage is applied as the drive voltage are executed collectively and successively.

The storage controlling apparatus may be configured such that the command decoder further decides whether or not the commands are a combination of one read command and one program command, and the command processing section collectively and successively executes, when it is decided that the access object addresses of the read command and the program command correspond to words different from each other in the same block of the memory cell array, those of operations in processing of the read command and the program command in which a read drive voltage is applied as the drive voltage. In the storage controlling apparatus, those of operations in processing of a read command and a program command in which an equal voltage is applied as the drive voltage are executed collectively and successively.

The storage controlling apparatus may be configured such that the command decoder further decides whether or not the commands are a combination of one erasure command and one program command, and the command processing section collectively and successively executes, when it is decided that the access object addresses of the erasure command and the program command correspond to words different from each other in the same block of the memory cell array, those of operations in processing of the erasure command and the program command in which a read drive voltage is applied as the drive voltage. In the storage controlling apparatus, those of operations in processing of an erasure command and a program command in which an equal voltage is applied as the drive voltage are executed collectively and successively.

According to a second embodiment of the present technology, there is provided a storage apparatus including a memory cell array configured from a plurality of divisional blocks which have a common plate, a driver configured to supply a drive voltage between the plate and a bit line, a command decoder configured to decide whether or not a plurality of access object addresses of different commands included in a command string correspond to words different from each other in the same block of the memory cell array, and a command processing section configured to collectively and successively execute, when it is decided that the access object addresses of the commands correspond to words different from each other in the same block of the memory cell array, those of operations in processing of the commands in which an equal voltage is applied as the drive voltage. In the storage apparatus, those of operations in processing of a plurality of commands for the memory cell array in which an equal voltage is applied from the driver are executed collectively and successively. The storage apparatus may be configured such that the memory cell array is a resistance change memory.

With the storage controlling apparatus and storage controlling method and the storage apparatus of the present technology, occurrence of charging and discharging in a resistance change memory can be suppressed to reduce the power consumption advantageously.

The above and other objects, features and advantages of the present technology will become apparent from the following description and the appended claims, taken in conjunction with the accompanying drawings in which like parts or elements are denoted by like reference characters.

BRIEF DESCRIPTION OF THE DRAWINGS

FIG. 1 is a block diagram showing an example of a configuration of an information processing system according to a first embodiment of the present technology;

FIG. 4 is a block diagram showing an example of a functional configuration of a memory of the information processing system of FIG. 1;

DETAILED DESCRIPTION OF THE PREFERRED EMBODIMENTS

Figure 2:
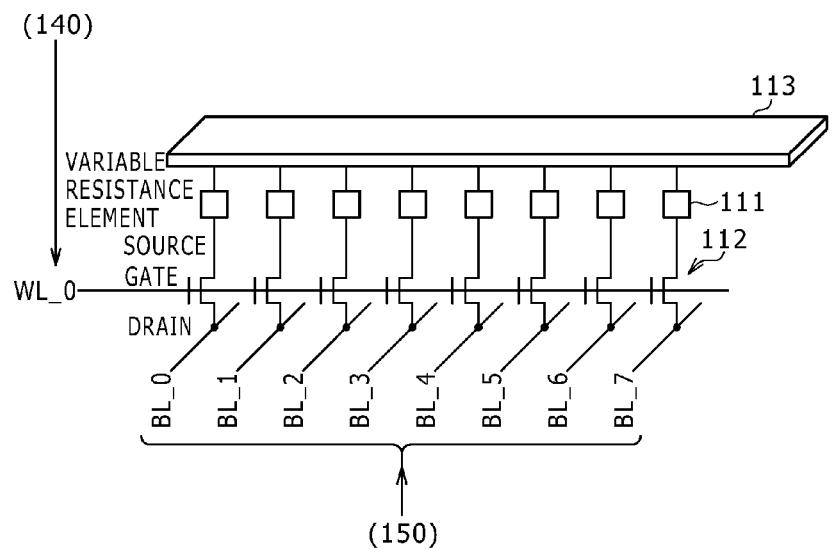
FIG. 2 is a schematic view showing an example of a structure of a memory cell array of the information processing system of FIG. 1.

In the following, embodiments of the present technology are described. The description is given in the following order.
1. First Embodiment (example wherein a read command and a write command are utilized)
2. Second Embodiment (example wherein a read command, an erasure command and a program command are utilized)

1. First Embodiment

Configuration of the Information Processing System

FIG. 1 shows an example of a configuration of an information processing system according to a first embodiment of the present technology. Referring to FIG. 1, the information processing system shown includes a memory 100, a memory controller 200, and a host computer 300. The memory 100 is assumed to be a resistance change memory (ReRAM) which includes a memory cell array 110 formed from variable resistive elements. The host computer 300 issues a read command or a write command to the memory 100 to access the memory 100. The memory controller 200 is connected between the memory 100 and the host computer 300 to carry out access control to the memory 100. It is to be noted that a read command or a write command is sometimes issued based on decision of the memory controller 200 itself.

The memory 100 includes a storage section configured from a plurality of blocks 101, 102 and so forth, a controlling interface 120, a control section 130, and a command queue 131. The controlling interface 120 administers communication with the memory controller 200. The control section 130 controls access to the blocks of the storage section. The command queue 131 retains a command to be processed by the memory 100. While the command queue 131 is configured separately from the control section 130, it may otherwise be built in the control section 130 or else may be built in the controlling interface 120.

Each block of the storage section, for example, the block 101, includes a memory cell array 110, a word line decoder 140, a bit line selector 150 and a driver 160.

The memory cell array 110 includes an access transistor and a variable resistive element at each of crossing points between a plurality of word lines WL and a plurality of bit lines BL. Here, in order to simplify the description, a memory cell array having 64 crossing points between eight word lines x eight bit lines is exemplified. In this instance, the memory cell array 110 includes eight word lines WL_0 to WL_7 and eight bit lines BL_0 to BL_7, and a plate terminal. The eight word lines WL_0 to WL_7 are connected to the word line decoder 140. The eight bit lines BL_0 to BL_7 are connected to the bit line selector 150. The plate terminal is connected to a plate voltage output of the driver 160.

Each of the variable resistive elements of the memory cell array 110 records information of 1 bit in two states including a high resistive state (HRS) and a low resistive state (LRS). Although the association between the states and the logical values can be determined arbitrarily, in the following description, the logical values are defined such that the low resistive state is used to represent the logical value "0" and the high resistive state is used to represent the logical value "1." Further, a change between the two states is referred to as bit inversion operation. As the bit inversion operation, two operations are available including a set operation and a reset operation. In the following description, the set operation changes the state of a bit from the high resistive state to the low resistive state, and the reset operation changes the state of a bit from the low resistive state to the high resistive state. In other words, the set operation changes the state of the bit of the logical value "1" to the state of the logical value "0," and the reset operation changes the state of the bit of the logical value "0" to the state of the logical value "1." In a write process, the set operation and the reset operation are carried out in order. However, as the order in which the set operation and the reset operation are carried out, whichever one of the operations may be carried out first.

The word line decoder 140 receives a word line designation from the control section 130 and controls the eight word lines of the memory cell array 110. In particular, the word line decoder 140 has a function of driving a word line designated by the control section 130 with the logical value "H" and driving the other word lines with the logical value "L." If no word line is designated or if a word line designation is canceled, then the word line decoder 140 drives all word lines with the logical value "L."

The bit line selector 150 transfers read data read out from the memory cell array 110 or write data for being written between the control section 130 and the controlling interface 120. Further, the bit line selector 150 receives a voltage for driving a bit line from the driver 160.

The bit line selector 150 roughly has two functions. In particular, the bit line selector 150 has a function as a sense amplifier upon reading out from the memory cell array 110. In particular, the bit line selector 150 measures the amount of current flowing through a bit line to decide which one of the low resistive state and the high resistive state a selected variable resistive element has to determine the logical value "0"

or "1" for each bit line. The determined logical value is outputted to the control section 130 or the controlling interface 120.

Further, the bit line selector 150 has, upon writing into the memory cell array 110, a function of selecting a drive voltage for each bit line based on a designation by the control section 130. In particular, the bit line selector 150 selectively supplies a plate voltage or a bit line voltage supplied thereto from the driver 160 to each bit line.

The driver 160 supplies a bit line voltage to the bit line selector 150 and supplies a plate voltage to the bit line selector 150 and the memory cell array 110. In other words, the driver 160 supplies a drive voltage between the plate and a bit line.

Structure of the Memory Cell Array

FIG. 2 shows an example of a structure of the memory cell array 110 in the first embodiment of the present technology. While, in FIG. 2, a cross section along the one word line WL_0 is schematically shown, also the other word lines have a similar structure. At each of the crossing points between the word line WL_0 and the eight bit lines BL_0 to BL_7, a FET (Field Effect Transistor) 112, which is an access transistor, and a variable resistive element 111 are connected.

The word line WL_0 is connected to the gate terminal of the eight FETs 112, and the eight bit lines BL_0 to BL_7 are connected to the drain terminal of the individually corresponding FETs 112. The eight FETs 112 are connected at the source terminal thereof to the plate 113 individually through the variable resistive elements 111. All of the FETs 112, here, the 64 FETs 112, which configure the memory cell array 110 in the same block, are connected at the source terminal thereof to the plate 113 through the individually corresponding variable resistive elements 111.

Figure 3:
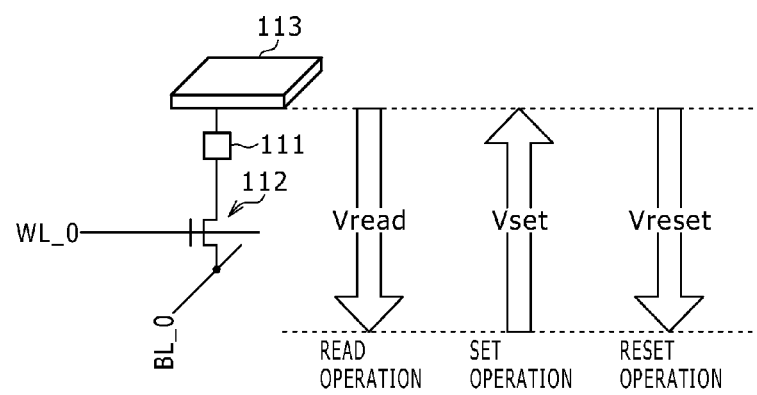
FIG. 3 is a schematic view illustrating a drive voltage for the memory cell array shown in FIG. 2.

FIG. 3 illustrates a drive voltage of the memory cell array 110 in the first embodiment of the present technology. As operations for each variable resistive element 111 of the memory cell array 110, a read operation for reading out a state of the variable resistive element 111 is available in addition to the set operation and the reset operation described hereinabove. Among the three operations, namely, among the read operation, set operation and reset operation, the drive voltage between the plate 113 and the bit line BL_0 differs.

In the case of the set operation, the voltage bias is set so that the plate 113 has a potential of "+Vset" with respect to the bit line. In the case of the reset operation, the voltage bias is set so that the bit line has a potential of "+Vreset" with respect to the plate 113. In the case of the read operation, the voltage bias is set so that the bit line has a potential of "+Vread" with respect to the plate 113.

Functional Configuration of the Memory

FIG. 4 shows an example of a functional configuration of the memory 100 in the first embodiment of the present technology. Referring to FIG. 4, the memory 100 includes, in addition to the command queue 131, word line decoder 140, bit line selector 150, driver 160 and memory cell array 110 described hereinabove, a command decoder 132 and a command processing section 133.

The command queue 131 retains read commands, write commands and so forth issued from the host computer 300 or the like in order. The command queue 131 is configured from a FIFO (First-In First-Out) memory, a RAM or the like. Although the command queue 131 is provided at any place in the memory 100 as described above, it need be configured such that it retains a plurality of commands such that the commands can be referred to from the command decoder 132 and the command processing section 133. The command decoder 132 refers through a signal line 135, and the command processing section 133 refers through a signal line 136, to a command retained in the command queue 131.

The command decoder 132 decodes a plurality of commands retained in the command queue 131 to extract information of a type of each command, an access object address of the memory cell array 110 and so forth. The command decoder 132 decides, for example, to which one of a write command and a read command each of a plurality of commands retained in the command queue 131 corresponds. Further, the command decoder 132 decides, for example, to which one of words of the memory cell array 110 and to which block the access object address of each of a plurality of commands retained in the command queue 131 corresponds.

The read command is configured from information representing that the pertaining command is a read command, information representative of a block, and a word line number from which reading out is to be carried out in the memory cell array 110 in the designated block. The write command is configured from information representing that the pertaining is a write command, information representative of a block, a word line number into which writing is to be carried out in the memory cell array 110 in the designated block, and write data to be written.

In the following description, as the information for specifying a word line of a writing object, information representative of a block and a word line number into which writing is to be carried out in the memory cell array 110 in the designated block are used in combination. Depending upon mounting of the memory, a mechanism such as a page number is sometimes introduced such that one-by-one conversion from a page number into a block number and a word line number or vice versa is carried out. However, there is no essential difference. It is to be noted that the one-by-one conversion may be carried out in the case where a table and the like is used or in the case where a high order bit or bits of the page number are used as a bank number while the remaining low order bits are used as a word line number. Further, depending upon different mounting of the memory, a plurality of page numbers sometimes correspond to a single word line by dividing a plurality of bits selected by one word line into two or more pages. However, there is no essential difference.

The command processing section 133 carries out control for implementing contents of a process with regard to each of a plurality of commands retained in the command queue 131. The command processing section 133 connects to the word line decoder 140 through a signal line 137, connects to the bit line selector 150 through a signal line 138, and connects to the driver 160 through a signal line 139. The command processing section 133 controls the word line decoder 140, bit line selector 150 and driver 160 in accordance with information decoded by the command decoder 132.

For example, when the command decoder 132 decodes the command that the command is a read command, then the command processing section 133 controls the driver 160 so that a drive voltage of "+Vread" is applied to the plate 113 in order to carry out a read operation. Further, for example, if the command decoder 132 decodes the command that the command is a write command, then a read operation for pre-reading, a set operation, a read operation for pre-reading, a reset operation, and a read operation for verify are carried out successively. Thereupon, the command processing section 133 controls the driver 160 so that drive voltages necessary for the operations are applied between the bit line and the plate 113.

It is to be noted that, while it is assumed here that the functional configurations are disposed in the memory 100, also it seems a possible idea to dispose, for example, the command queue 131, command decoder 132 and command processing section 133 in the memory controller 200.

Figure 5A:
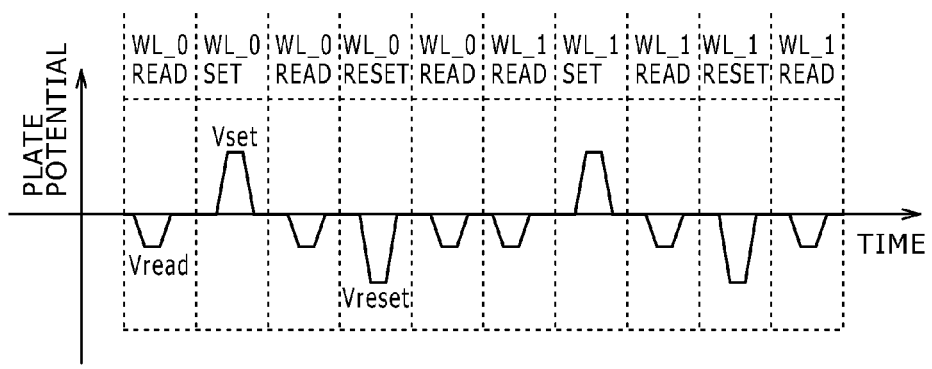
FIGS. 5A and 5B are timing charts illustrating a drive voltage necessary to process a write command in the information processing system of FIG. 1.
Figure 5B:
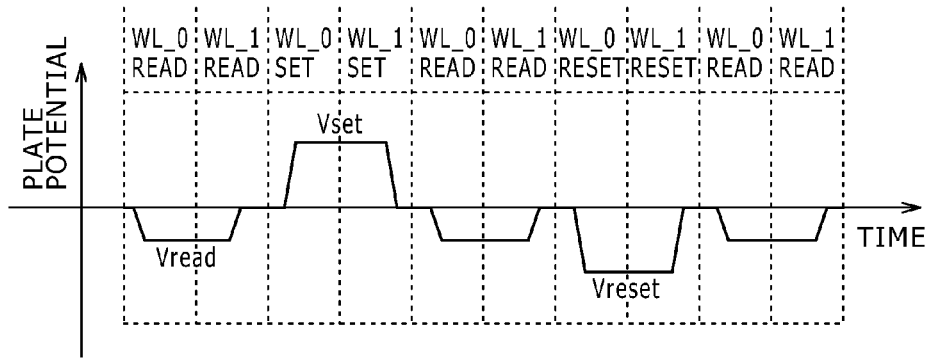

FIGS. 5A and 5B illustrate a drive voltage necessary to process a write command. In FIGS. 5A and 5B, a plate potential in the case where the potential at the bit line is fixed is illustrated. As described hereinabove, when the write command is to be processed, a read operation, a set operation, another read operation, a reset operation and a further read operation are successively carried out. In this instance, the drive voltage applied between the bit line and the plate 113 indicates different potentials among the read operation, set operation and reset operation. When two write commands are issued successively, if they are executed in the order of the commands, then the drive voltage varies frequently as seen from FIG. 5A and high electric power is consumed by charging and discharging thereupon.

Therefore, in the first embodiment of the present technology, operations corresponding to the two write commands for different words are executed collectively as seen in FIG. 5b to suppress the variation of the drive voltage. Consequently, charging and discharging involved in a variation of the drive voltage are suppressed to achieve power saving.

Operation of the Memory

Figure 6:
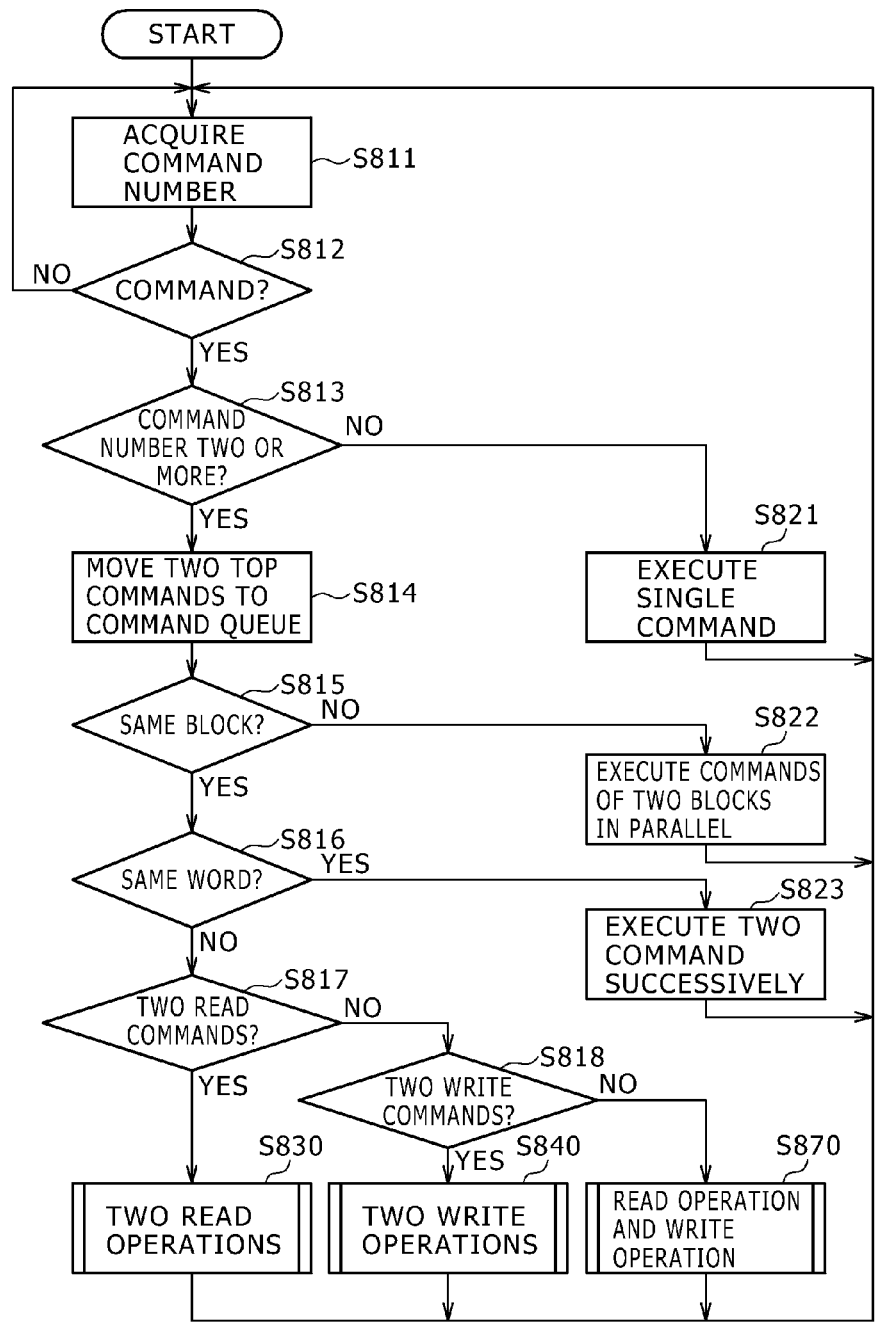
FIG. 6 is a flow chart illustrating an example of a processing procedure of the memory of FIG. 4.

FIG. 6 illustrates an example of a processing procedure of the memory 100 in the first embodiment of the present technology. The memory controller 200 forms a command group configured from a read command, a write command or a read command and a write command in accordance with an instruction from the host computer 300 and writes the command group into the controlling interface 120 of the memory 100. It is to be noted that the memory controller 200 can issue a command or the like based on a decision by the memory controller 200 itself.

The control section 130 of the memory 100 reads out a number of commands retained in the controlling interface 120 at step S811. Then, the control section 130 decides the read out command number at step S812. Then, if the number of commands is zero, namely, if the controlling interface 120 does not retain any command and the decision at step S812 is No, then the processing returns to step S811. In this manner, the steps S811 and S812 form a polling loop, and while the control section 130 waits in the polling loop, it is expected that a command is written from the memory controller 200.

The control section 130 further decides the read out command number at step S813. If the command number is two or more, namely, if the decision at step S813 is Yes, then the control section 130 moves two top ones of the command retained in the controlling interface 120 to the command queue 131 at step S814. On the other hand, if the command number is one at step S813, namely, if the decision at step S813 is No, then the control section 130 executes the single command, which is a read command or a write command, retained in the controlling interface 120 at step S821. The execution processing procedures of the read command and the write command are hereinafter described with reference to FIGS. 7 and 8. After the commands are executed, the processed commands retained in the controlling interface 120 are abandoned, and then the processing returns to step S811.

After step S814, the processing advances to step S815, at which the control section 130 decides whether or not the two commands placed in the command queue 131 relate to the same block at step S815. If the two commands relate to different blocks, namely, if the decision at step S815 is No, then the two commands, which are a read command and a write command, are executed in parallel in the individual blocks at step S822. The execution processing procedures of the read command and the write command are hereinafter described with reference to FIGS. 7 and 8. After the two commands are executed, the two processed commands retained in the command queue 131 are abandoned, and then the processing returns to step S811.

It is to be noted that also it seems a possible idea to use a method wherein the commands retained in the controlling interface 120 are decided again before the two command retained in the command queue 131 are executed at step S822. In other words, it seems a possible idea to combine, when commands which relate to the same block but to different word line numbers exist, the commands and the command retained in the command queue 131 to carry out the procedure beginning with step S817.

When the two commands relate to the same block at step S815, namely, when the decision at step S815 is Yes, the control section 130 further decides whether or not the two commands relate to the same word at step S816. If the two words relate to the same word of the same block at step S816, namely, if the decision at step S816 is Yes, then the control section 130 successively executes the two commands, which may be read commands or write commands, placed in the command queue 131 at step S823. This is because it is necessary to successively execute the commands for the same word line number of the same block. Also, different commands are supposed to be carried out successively in this embodiment. The execution processing procedures of the read commands and the write commands are hereinafter described with reference to FIGS. 7 and 8. After the two commands are executed, the two commands processed already and retained in the command queue 131 are abandoned, and then the processing returns to step S811.

It is to be noted that, before the two commands retained in the command queue 131 are executed at step S823, the commands retained in the controlling interface 120 may be decided again. At this time, if those commands which relate to the same block but to word lines of different word line numbers exist, the commands and the commands retained in the command queue 131 may be combined to carry out the procedure beginning with step S817.

It is to be noted that, when the two commands retained in the command queue 131 are executed at step S823, the characteristic that the commands relate to the same word line number of the same block may be utilized to execute the commands efficiently based on such a concept as described below. In particular, when the two commands are read commands, after the first read command is executed, the operation of the second read command is omitted and data read out by the first read command is conveyed to the memory controller 200. When the two commands are write commands, the first write command is abandoned, and only the second write command is executed. When the two commands are a read command and a write command and the order of the two commands is the write command and the read command, the read command is not executed and data given as the write data is transferred to the memory controller 200. If the order of the two commands is the read command and the write command, then data read out by the read operation at step S922 by the write command is transferred as data of the read command to the memory controller 200, and then operation of the write command is carried out. The promotion in efficiency by such omission of a command operation is effective for reduction of the execution time but provides a defect that operation of the memory 100 as viewed from the host system becomes opaque. Therefore, a function of initially setting it upon turning on of the power supply or the like whether or not such omission is to be permitted may be provided. Further, a command which permits such omission as described above and another command which does not permit the omission may be selectively used properly.

After step S816, the control section 130 decides a combination of command types of the two commands which relate to the same block and but to different words at steps S817 and S818. If a result of the decision indicates that the two commands are two read commands, then a process at step S830 is executed, but if the result of the decision indicates that the two commands are two write commands, then a process at step S840 is executed. However, if the result of the decision indicates that the two commands is a combination of one read command and one write command, then a process at step S870 is executed.

Figure 7:
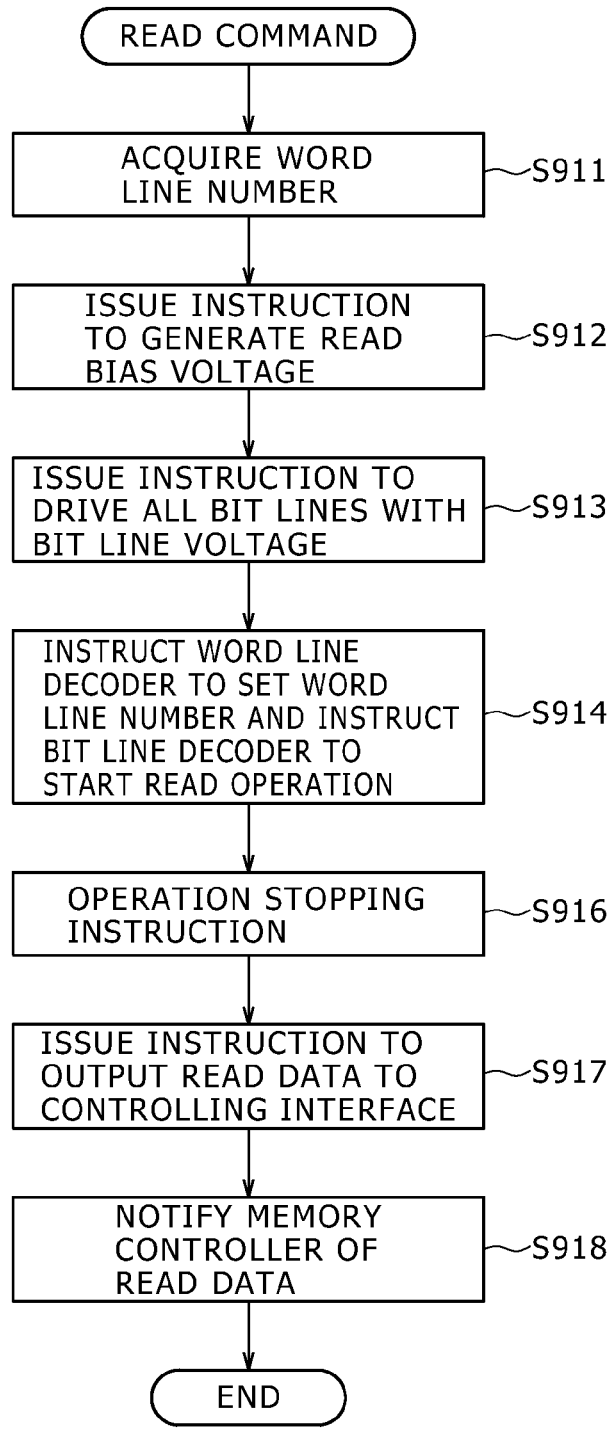
FIG. 7 is a flow chart illustrating an example of a processing procedure of one read command in the information processing system of FIG. 1.

FIG. 7 illustrates an example of a processing procedure of one read command in the embodiment of the present technology. It is to be noted that it is assumed here that information indicative of the block 101 is designated as a block number which is a component of the read command and WL_0 is designated as the word line number.

First, the control section 130 acquires a block number and a word line number which are components of the read command from the controlling interface 120 at step S911. Here, as described above, information indicative of the block 101 is acquired as a block number, and WL_0 is acquired as a word line number. Since the block 101 is designated as the block number, the control section 130 thereafter issues an instruction to the components of the block 101.

The control section 130 instructs the driver 160 to generate a voltage bias in a read operation at step S912. In particular, the control section 130 sets the bit line voltage so that it becomes the potential of "+Vread" with respect to the plate voltage. The plate 113 of the memory cell array 110 is driven by the plate voltage supplied from the driver 160.

The control section 130 instructs the bit line selector 150 to drive all bit lines with the bit line voltage at step S913. The bit line selector 150 supplies the bit line voltage supplied thereto from the driver 160 to all bit lines in accordance with the instruction from the control section 130.

The control section 130 sets the word line number designated by the read command, here, the word line number WL_0, to the word line decoder 140 and instructs the bit line selector 150 to start a reading out operation at step S914. The word line decoder 140 drives the word line WL_0 corresponding to the designated word line number, here, WL_0, with the logical value "H." Consequently, the access transistors connected to the word line WL_0 are placed into a conducting state, and the voltage bias in the read operation generated by the driver 160 is applied to the variable resistive elements. Consequently, electric current flows through the bit lines to the bit line selector 150 in response to the high resistive state or the low resistive state of each of the elements. The bit line selector 150 measures the amount of current flowing thereto to determine the logical value "0" or "1" corresponding to each variable resistive element. Consequently, the logical state of each of the variable resistive elements connected to the designated word line WL_0 is read out by the bit line selector 150.

After the reading out is completed, the control section 130 instructs the bit line selector 150 to stop the reading out operation at step S916. In particular, the control section 130 cancels the setting of the word line number to the word line decoder 140, cancels the driving instruction of the bit line to the bit line selector 150 and instructs the driver 160 to stop the generation of the voltage bias. It is to be noted that, although the timing of the completion of the reading out may be determined by a clock which the control section 130 or the like has internally or may be determined in response to confirmation by the bit line selector 150 that a sufficient current amount has been assured, detailed description of the same is omitted herein.

Then, the control section 130 issues an instruction to output data read out by the bit line selector 150 to the controlling interface 120 at step S917. Then, the control section 130 instructs the controlling interface 120 to notify the memory controller 200 of the read out data at step S918.

Figure 8:
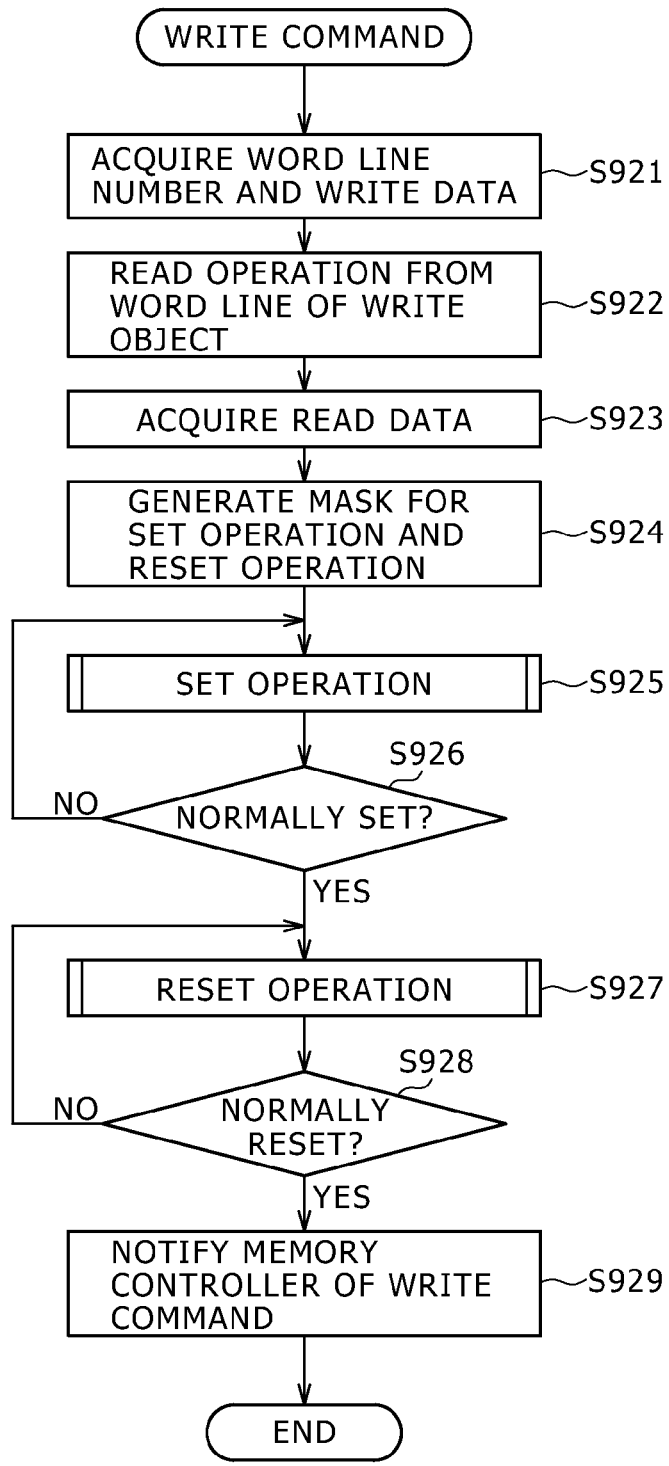
FIG. 8 is a flow chart illustrating an example of a processing procedure of one write command in the information processing system of FIG. 1.

FIG. 8 illustrates an example of a processing procedure of one write command in the first embodiment of the present technology. Here, it is assumed that information indicative of the block 101 is designated as a block number which is a component of the write command and WL_0 is designated as a word line number and besides a value "6," which is "00000110" in binary notation, is designated as data to be written.

Further, it is assumed that, as a situation before writing is carried out, a value "3," which is "00000011" in binary notation, is recorded in the bit group corresponding to the word line WL_0 of the memory cell array 110 in the block 101. If they are observed for each bit, then it is necessary to change the bit corresponding to the bit line BL_0 from the logical value "1" at present to the logical value "0." The bit corresponding to the bit line BL_1 need not be changed but may remain the logical value "1" at present. It is necessary to change the bit corresponding to the bit line BL_2 from the logical value "0" at present to the logical value "1." The bits corresponding to the bit lines BL_7 to BL_3 may remain the logical value "0" at present and need not be changed.

In writing into nonvolatile memories including a ReRAM, in order to prevent unnecessary bit inversion or overwriting, a method of comparing recorded information and information to be written with each other and carrying out only bit inversion of a required minimum number of bits is used frequently. In particular, in the case of the present example, it is preferable to carry out bit inversion only for the bit corresponding to the bit line BL_0 and the bit corresponding to the bit line BL_2 while the other bits keep their situation at present. Therefore, in the embodiment described below, information at positions for which writing is to be carried out is read out first, and bits for which inversion is to be carried out are determined, and then a bit inversion operation is carried out only for the determined bits.

The control section 130 acquires a block number, a word line number and data for writing which are components of the write command from the controlling interface 120 at step S921. Here, the information representative of the block 101 as the block number and WL_0 as the word line number are acquired as described hereinabove. Since the block 101 is designated as the block number, the control section 130 thereafter instructs the components of the block 101.

The control section 130 carries out the processes at steps S912 to S916 described hereinabove with reference to FIG. 7 to read out a value recorded at present at the bits corresponding to the designated word line number, here, WL_0, at step S922. The control section 130 accesses the bit line selector 150 to acquire the data read out from the memory cell array 110 at step S923.

The control section 130 compares the data read out from the memory cell array 110 with the write data for writing to determine those bits for which a set operation is to be carried out and those bits for which a reset operation is to be carried out at step S924. In other words, at this step, the control section 130 generates a value of a binary notation "00000001" wherein the value "1" is allocated only to the bit BL_0, as a bit pattern, namely, as a set mask, with which a set operation is to be carried out. Further, the control section 130 generates a value of a binary notation "00000100" wherein the value "1" is allocated only to the bit BL_2 as a bit pattern, namely, as a reset mask, with which a reset operation is to be carried out.

The control section 130 carries out a set operation at step S925 and repeats the set operation until it is decided at step S926 that a set operation has been carried out normally. An execution processing procedure of the set operation at step S925 is hereinafter described with reference to FIG. 9. At step S926, the control section 130 particularly compares the read out data and the bit pattern to be used for the set operation with each other to confirm whether or not a set operation has been carried out normally. It is to be noted that, in the set operation in the second or later operation cycle, only those bits with regard to which it is found that a set operation has not been carried out normally at step S926 are determined as a set operation object. Further, in order to determine an upper limit to the number of times by which a set operation is to be retried by a reading operation following a set operation, a counter may be provided such that a failure in retry by more than the prescribed number of times is determined as an error. However, description of this technique is omitted herein.

The control section 130 carries out a reset operation at step S927 and repeats the reset operation until it is decided at step S928 that a reset operation has been carried out normally. An execution processing procedure of the reset operation at step S927 is hereinafter described with reference to FIG. 10. At step S928, the control section 130 particularly compares the read out data and the bit pattern to be used for the reset operation with each other to confirm whether or not a reset operation has been carried out normally. It is to be noted that, in the reset operation in the second or later operation cycle, only those bits with regard to which it is found that a reset operation has not been carried out normally at step S928 are determined as a reset operation object. Further, in order to determine an upper limit to the number of times by which a reset operation is to be retried by a reading operation following a reset operation, a counter may be provided such that a failure in retry by more than the prescribed number of times is determined as an error. However, description of this technique is omitted herein.

After the processes described above are completed, the control section 130 instructs the controlling interface 120 to notify the memory controller 200 of the end of the write command at step S929.

Figure 9:
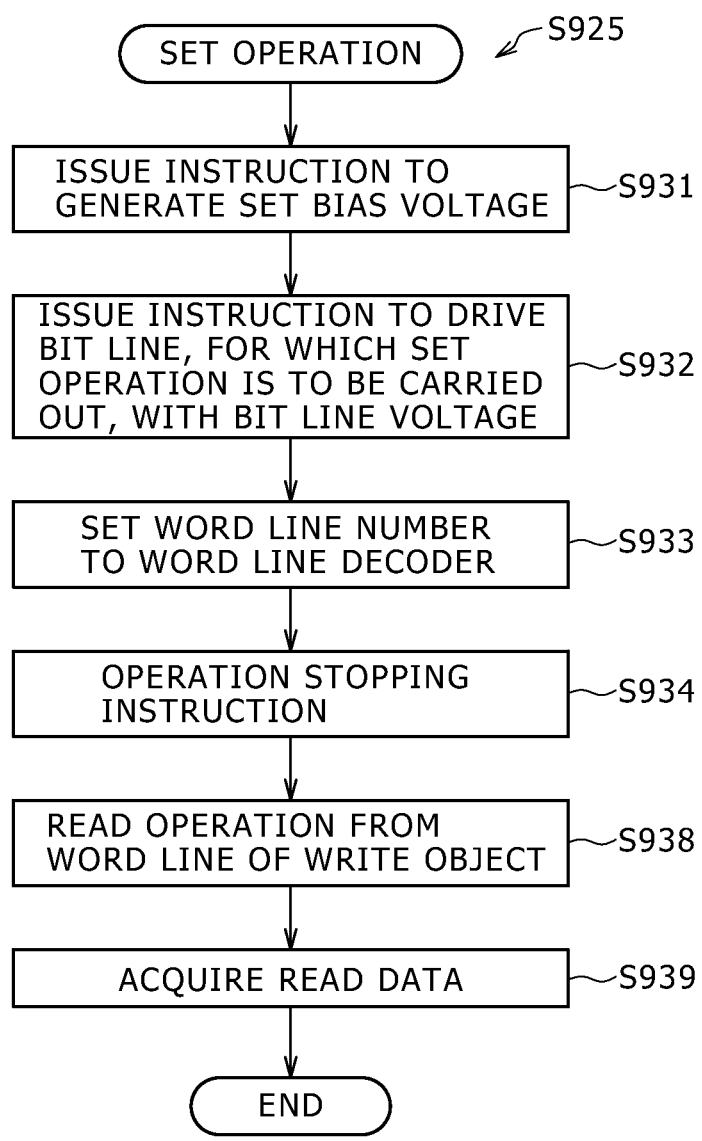
FIG. 9 is a flow chart illustrating an example of a processing procedure of one set operation in the processing procedure illustrated in FIG. 8.

FIG. 9 illustrates an example of a processing procedure of one set operation in the first embodiment of the present technology, namely, at step S925 of FIG. 8. Referring to FIG. 9, the control section 130 instructs the driver 160 to generate a voltage bias for the set operation at step S931. In particular, the control section 130 carries out setting so that the plate voltage becomes "+Vset" with respect to the bit line voltage. The plate of the memory cell array 110 is driven by the plate voltage supplied from the driver 160.

The control section 130 provides a cell pattern for carrying out a set operation to the bit line selector 150 and instructs the bit line selector 150 to drive those bit lines which correspond to the value "1" with the bit line voltage and drive those bit lines which correspond to the value "0" with the plate voltage at step S932. The bit line selector 150 supplies the bit line voltage or the plate voltage supplied thereto from the driver 160 in accordance with the instruction from the control section 130.

Here, the cell pattern for carrying out a set operation when the process at step S932 is executed for the first time is a set mask "00000001" generated at step S924. Consequently, only the bit line BL_0 is driven with the bit line voltage while the other bit lines BL_7 to BL_1 are driven with the plate voltage. When the process at step S932 is executed for the second or later time, a set mask wherein only those bits with regard to which it is found that a set operation has not been carried out normally at step S926 are set to "1" is used.

The control section 130 sets the word line number designated by the write command, here, WL_0, to the word line decoder 140 at step S933. The word line decoder 140 drives the word line WL_0 corresponding to the designated word line number WL_0 with the logical value "H." Consequently, the access transistors connected to the word line WL_0 are placed into a conducting state.

At this time, the plate 113 of the memory cell array 110 is in a state driven with the plate voltage supplied from the driver 160 and the bit line BL_0 is in a state driven with the bit line voltage depending upon the setting carried out at step S932. Since they provide a voltage bias necessary for the setting operation, a set operation is carried out for the variable resistive element connected at a crossing point between the word line WL_0 and the bit line BL_0. On the other hand, since the bit lines BL_7 to BL_1 are driven by the plate voltage depending upon the setting carried out at step S932, even if the access transistors are placed into a conducting state, no potential difference appears across the variable resistive elements and no bit inversion operation is carried out.

The control section 130 cancels the setting of the word line number to the word line decoder 140, cancels the driving instruction for the bit line to the bit line selector 150 and instructs the driver 160 to stop the generation of the voltage bias at step S934. It is to be noted that, although the timing of the completion of the set operation may be determined by a clock which the control section 130 or the like has internally or the like, detailed description of the same is omitted herein.

The control section 130 carries out a process similar to that at step S922 to read out a value recorded at present at a bit corresponding to the designated word line number, here, WL_0, at step S938. The control section 130 accesses the bit line selector 150 to acquire the data read out from the memory cell array 110 at step S939.

Figure 10:
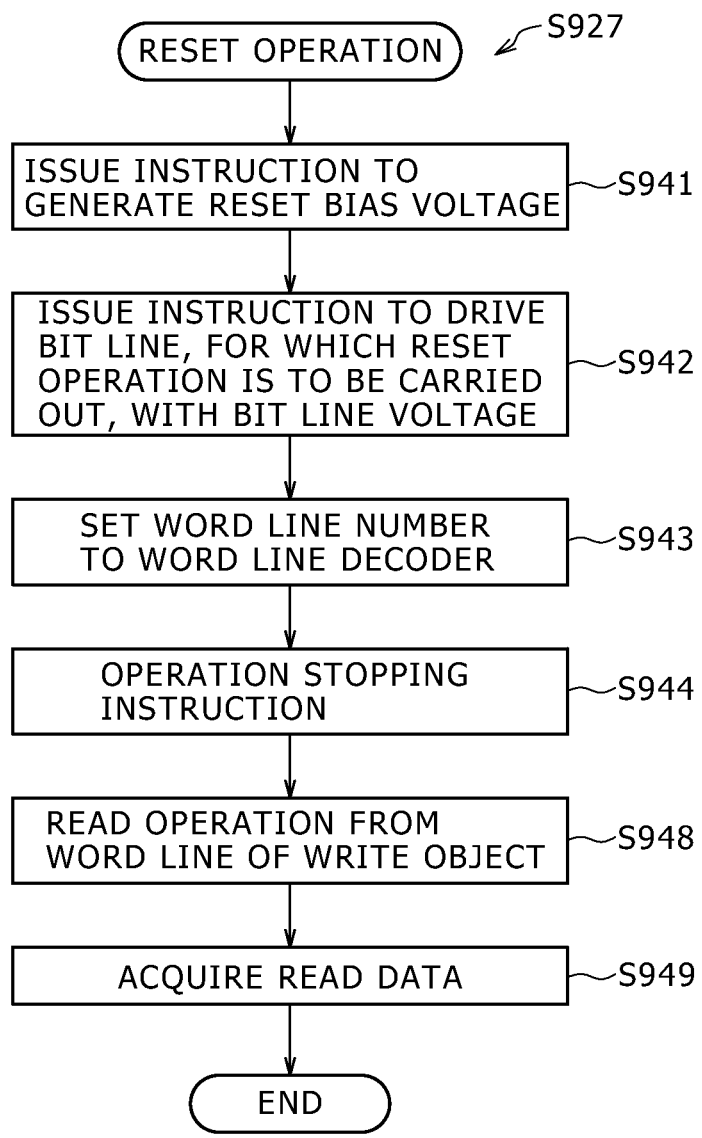
FIG. 10 is a flow chart illustrating an example of a processing procedure of one reset operation in the processing procedure illustrated in FIG. 8.

FIG. 10 illustrates an example of a processing procedure of one reset operation in the first embodiment of the present technology, namely, at step S927 of FIG. 8.

Referring to FIG. 10, the control section 130 instructs the driver 160 to generate a voltage bias for a reset operation at step S941. In particular, the control section 130 carries out setting so that the bit line voltage has a potential of "+Vreset" with respect to the plate voltage. The plate of the memory cell array 110 is driven with the plate voltage supplied thereto from the driver 160.

The control section 130 provides a cell pattern to be used for a reset operation to the bit line selector 150 and instructs the bit line selector 150 to drive those bit lines which correspond to the value "1" with the bit line voltage and drive those bit lines which correspond to the value "0" with the plate voltage at step S942. The bit line selector 150 supplies the bit line voltage or the plate voltage supplied thereto from the driver 160 in accordance with the instruction from the control section 130.

Here, if the process at step S942 is executed for the first time, then the cell pattern to be used for a reset operation is a reset mask "00000100" generated at step S924. In other words, only the bit line BL_2 is driven with the bit line voltage while the other bit lines, namely, the bit lines BL_7 to BL_3, BL_1 and BL_0, are driven with the plate voltage. When the process at step S942 is executed for the second or later time, a reset mask wherein only those bits with regard to which it is found that the reset operation has not been carried out normally at step S928 are set to "1" is used.

The control section 130 sets the word line number designated by the write command, here, the word line number WL_0, to the word line decoder 140 at step S943. The word line decoder 140 drives the word line WL_0 corresponding to the designated word line number WL_0 with the logical value "H." Consequently, the access transistors connected to the word line WL_0 are placed into a conducting state. At this time, the plate 113 of the memory cell array 110 is in a state driven with the plate voltage supplied from the driver 160, and the bit line BL_2 is in a state driven with the bit line voltage depending upon the setting carried out at step S942. Since they provide a voltage bias necessary for the reset operation, a reset operation is carried out for the variable resistive element connected to the crossing point between the word line WL_0 and the bit line BL_2. On the other hand, since the other bit lines, namely, the bit lines BL_7 to BL_3, BL_1 and BL_0, are driven with the plate voltage depending upon the setting carried out at step S942, even if the access transistors are placed into a conducting state, no potential difference appears across the variable resistive elements and no bit inversion operation is carried out.

The control section 130 cancels the setting of the word line number to the word line decoder 140, cancels the driving instruction for the bit lines to the bit line selector 150 and instructs the driver 160 to stop the generation of the voltage bias at step S944. It is to be noted that, although the timing of the completion of the reset operation may be determined by a clock which the control section 130 or the like has internally, detailed description of the same is omitted herein.

The control section 130 carries out the processes at steps S912 to S916 illustrated in FIG. 7 to read out values recorded at present at the bits corresponding to the designated word line number, here, WL_0, at step S948. The control section 130 accesses the bit line selector 150 to acquire the data read out from the memory cell array 110 at step S949.

Figure 11:
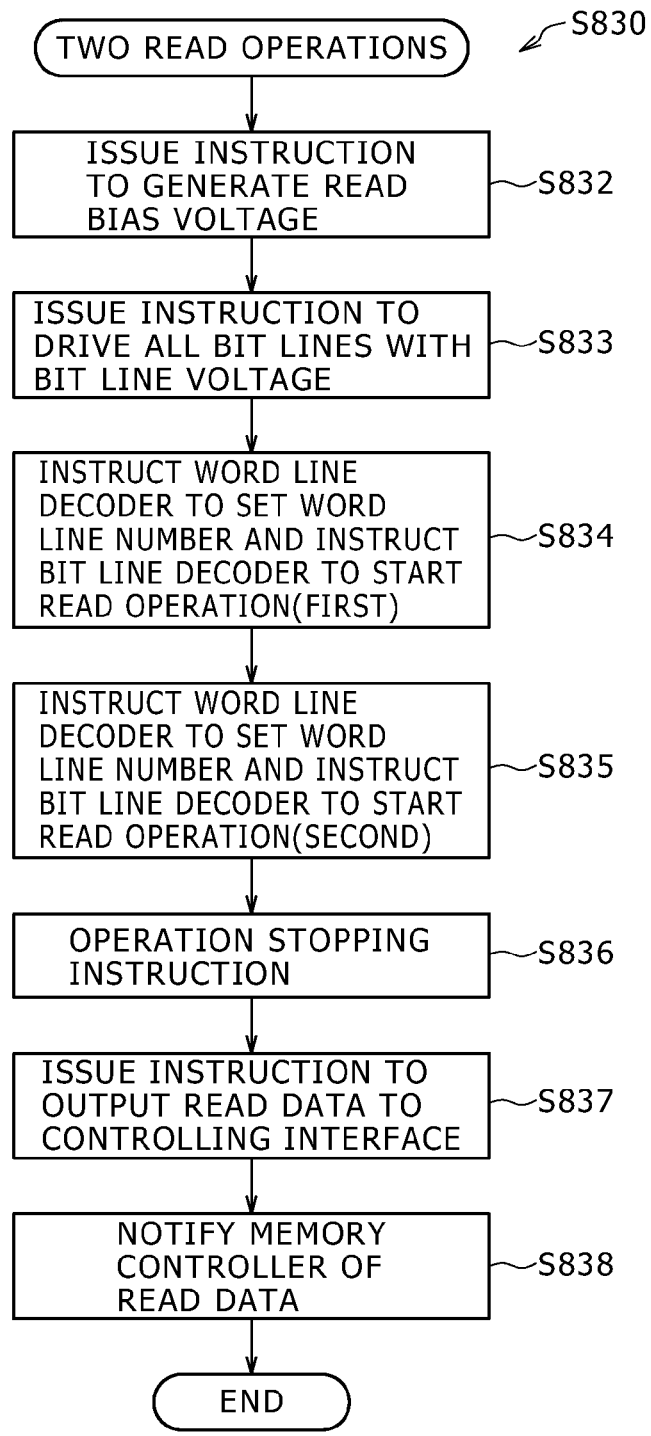
FIG. 11 is a flow chart illustrating an example of a processing procedure of two read operations in the processing procedure illustrated in FIG. 6.

FIG. 11 illustrates an example of a processing procedure of the two read operations in the first embodiment of the present technology, namely, the operations at step S830 of FIG. 6. In the following description, it is assumed that blocks of two read commands placed in the command queue 131 are represented as block 101, and one of the word line numbers is WL_3 while the other word line number is WL_6.

The control section 130 instructs the driver 160 to generate a voltage bias for a read operation at step S832 similarly as at step S912 in the operation of a read command described hereinabove with reference to FIG. 7. In particular, the control section 130 carries out setting of the bit line voltage so as to become the potential "+Vread" with respect to the plate voltage. The plate of the memory cell array 110 is driven with the plate voltage supplied from the driver 160.

The control section 130 instructs the bit line selector 150 to drive all bit lines with the bit voltage at step S833 similarly as at step S913 in the operation of the read command described hereinabove with reference to FIG. 7. The bit line selector 150 supplies the bit line voltage supplied from the driver 160 to all bit lines in accordance with the instruction from the control section 130.

The control section 130 sets the word line number designated by the first read command, here, WL_3, to the word line decoder 140 similarly as at step S914 in the operation of the read command described hereinabove with reference to FIG. 7. Then, the control section 130 instructs the bit line selector 150 to start a reading out operation at step S834. The word line decoder 140 drives the word line WL_3 corresponding to the designated word line number, here, WL_3, with the logical value "H." Consequently, the access transistor connected to the word line WL_3 is placed into a conducting state, and the voltage bias for the read operation generated by the driver 160 is applied to the variable resistive elements. Therefore, electric current in accordance with the high resistive state or the low resistive state of the individual elements flows into the bit line selector 150 through the bit lines. The bit line selector 150 measures the current amount flowing thereto to decide the logical value "0" or "1" corresponding to the variable resistive elements. Consequently, the logical states of the variable resistive elements connected to the word line WL_3 of the designated word line number WL_3 are read out by the bit line selector 150.

The control section 130 sets the word line number designated by the second read command, here, WL_6, to the word line decoder 140 similarly as at step S914 in the operation of the read command described hereinabove with reference to FIG. 7. Then, the control section 130 instructs the bit line selector 150 to start a reading out operation at step S835. The word line decoder 140 drives the word line WL_6 corresponding to the designated word line number, here, WL_6, with the logical value "H." Consequently, the access transistor connected to the word line WL_6 is placed into a conducting state, and the voltage bias for the read operation generated by the driver 160 is applied to the variable resistive elements. Therefore, electric current in accordance with the high resistive state or the low resistive state of the individual elements flows into the bit line selector 150 through the bit lines. The bit line selector 150 measures the current amount flowing thereto to decide the logical value "0" or "1" corresponding to the variable resistive elements. Consequently, the logical states of the variable resistive elements connected to the word line WL_6 of the designated word line number WL_6 are read out by the bit line selector 150.

The control section 130 issues an instruction to stop the operations at step S836 similarly as at step S916 in the operation of the read command described hereinabove with reference to FIG. 7. In particular, the control section 130 instructs the bit line selector 150 to stop the reading out operation and cancels the setting of the word line number to the word line decoder 140. Then, the control section 130 cancels the driving instruction of the bit line to the bit line selector 150 and instructs the driver 160 to stop the generation of the voltage bias.

It is to be noted that, although the timing of the completion of the reading out operations may be determined by a clock which the control section 130 or the like has internally or may be determined in response to confirmation by the bit line selector 150 that a sufficient current amount has been assured, detailed description of the same is omitted herein. Further, it sometimes is better to issue a read out stopping instruction to the bit line selector 150 intermediately between the reading out operations from the two word lines, namely, between the operations at steps S834 and S835 and then start reading out again.

The control section 130 issues an instruction to successively output data read out by the bit line selector 150 and corresponding to the two commands to the controlling interface 120 at step S837 similarly as at step S917 in the operation of the read command described hereinabove with reference to FIG. 7.

It is to be noted that, in order to maintain the compatibility with the flow chart of the read command described hereinabove with reference to FIG. 7, the description is given above assuming that the bit line selector 150 retains data for reading out twice. However, the bit line selector 150 may otherwise retain data for reading out once. For example, if data is outputted to the controlling interface 120 every time it is read out, particularly after each of the processes at steps S834 and S835, then the readout data to be retained by the bit line selector 150 may be data for reading out once.

The control section 130 instructs the controlling interface 120 to notify the memory controller 200 of the data read out corresponding to the two read commands at step S838 similarly as at step S918 in the operation of the read command described hereinabove with reference to FIG. 7.

Figure 12:
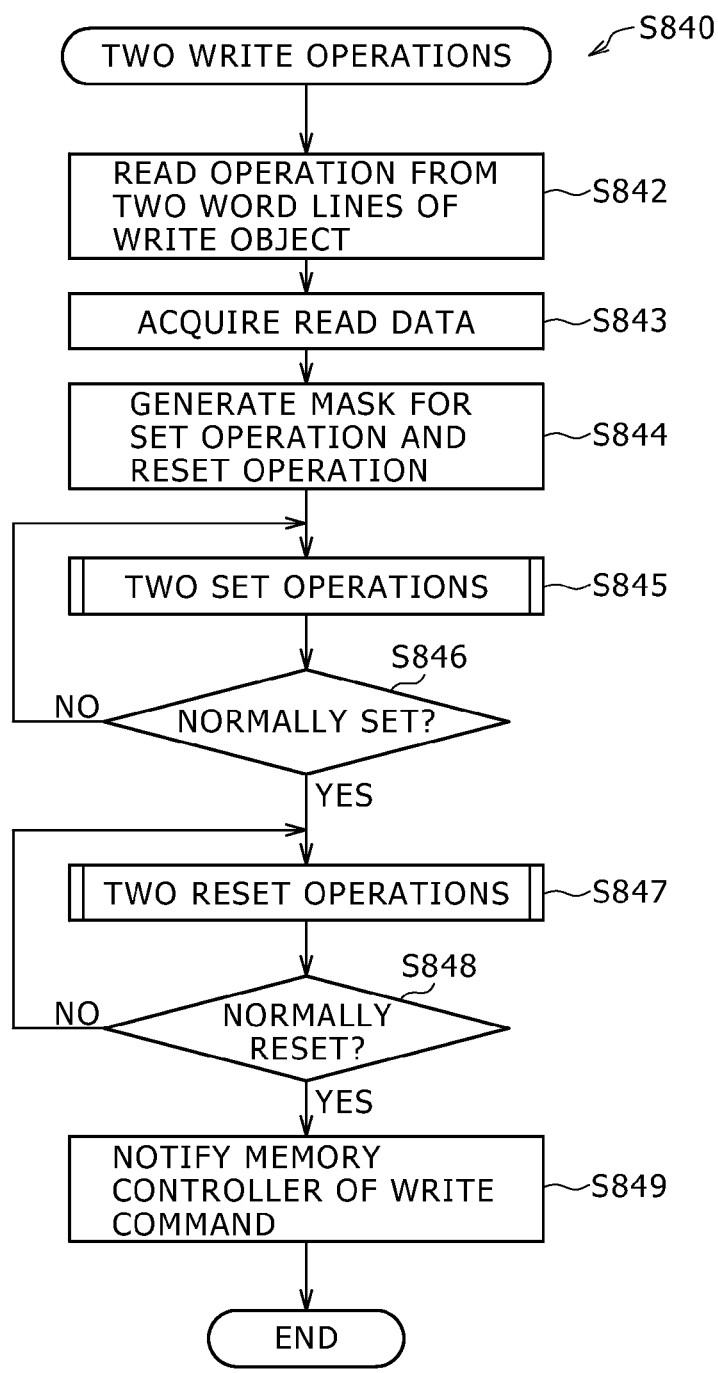
FIG. 12 is a flow chart illustrating an example of a processing procedure of two write operations in the processing procedure illustrated in FIG. 6.

FIG. 12 illustrates an example of a processing procedure of the two write operations in the first embodiment of the present technology, namely, at step S840 of FIG. 6. In the following description, it is assumed that the blocks of the two commands placed in the command queue 131 are the block 101 commonly and one of the word line numbers is WL_3 while the other word line number is WL_6.

The control section 130 first carries out operations similar to those described hereinabove in connection with the processes at steps S832 to S836 of FIG. 11 to read out values recorded at present at the bits corresponding to the two word line numbers designated by the two write commands, namely, WL_3 and WL_6, at step S842. This operation corresponds to the operation at step S922 in the write command described hereinabove with reference to FIG. 8.

The control section 130 accesses the bit line selector 150 similarly as at step S923 in the operation of the write command described hereinabove with reference to FIG. 8. Consequently, the control section 130 acquires data corresponding to the two write commands read out from the memory cell array 110 at step S843.

It is to be noted that, in order to maintain the compatibility with the flow chart of the write command described hereinabove with reference to FIG. 8, the description is given above assuming that the bit line selector 150 retains data for reading out twice. However, the bit line selector 150 may otherwise retain data for reading out once. For example, if data is inputted to the control section 130 every time it is read out, then the readout data to be retained by the bit line selector 150 may be data for reading out once.

The control section 130 compares the data read out from the memory cell array 110 and the data to be written with each other similarly as at step S924 in the operation of the write command described hereinabove with reference to FIG. 8. Then, the control section 130 determines a set mask representative of bits for which a setting operation is to be carried out and which corresponds to the two write commands and a reset mask representative of bits for which a reset operation is to be carried out at step S844.

The control section 130 carries out the two set operations at step S845 and repeats them until it is decided at step S846 that the setting has been carried out normally. The execution processing procedure of the two set operations at step S845 is hereinafter described with reference to FIG. 13. At step S846, particularly the control section 130 compares the read out data and the bit pattern to be used for a set operation with each other to confirm whether or not the set operation has been carried out normally. It is to be noted that, in the set operation for the second or later time, only those bits with regard to which it is found that a set operation has not been carried out normally at step S846 are determined as a set operation object. Further, in order to determine an upper limit to the number of times by which a set operation is to be retried by a reading operation following a set operation, a counter may be provided such that a failure in retry by more than the prescribed number of times is determined as an error. However, description of this technique is omitted herein.

The control section 130 carries out the two reset operations at step S847 and repeats them until it is decided at step S848 that the resetting has been carried out normally. The execution processing procedure of the two reset operations at step S847 is hereinafter described with reference to FIG. 14. At step S848, particularly the control section 130 compares the read out data and the bit pattern to be used for a reset operation with each other to confirm whether or not the reset operation has been carried out normally. It is to be noted that, in the reset operation for the second or later time, only those bits with regard to which it is found that a reset operation has not been carried out normally at step S848 are determined as a reset operation object. Further, in order to determine an upper limit to the number of times by which a reset operation is to be retried by a reading operation following a reset operation, a counter may be provided such that a failure in retry by more than the prescribed number of times is determined as an error. However, description of this technique is omitted herein.

After the processes described above are completed, the control section 130 instructs the controlling interface 120 to notify the memory controller 200 of the end of the write command at step S849.

Figure 13:
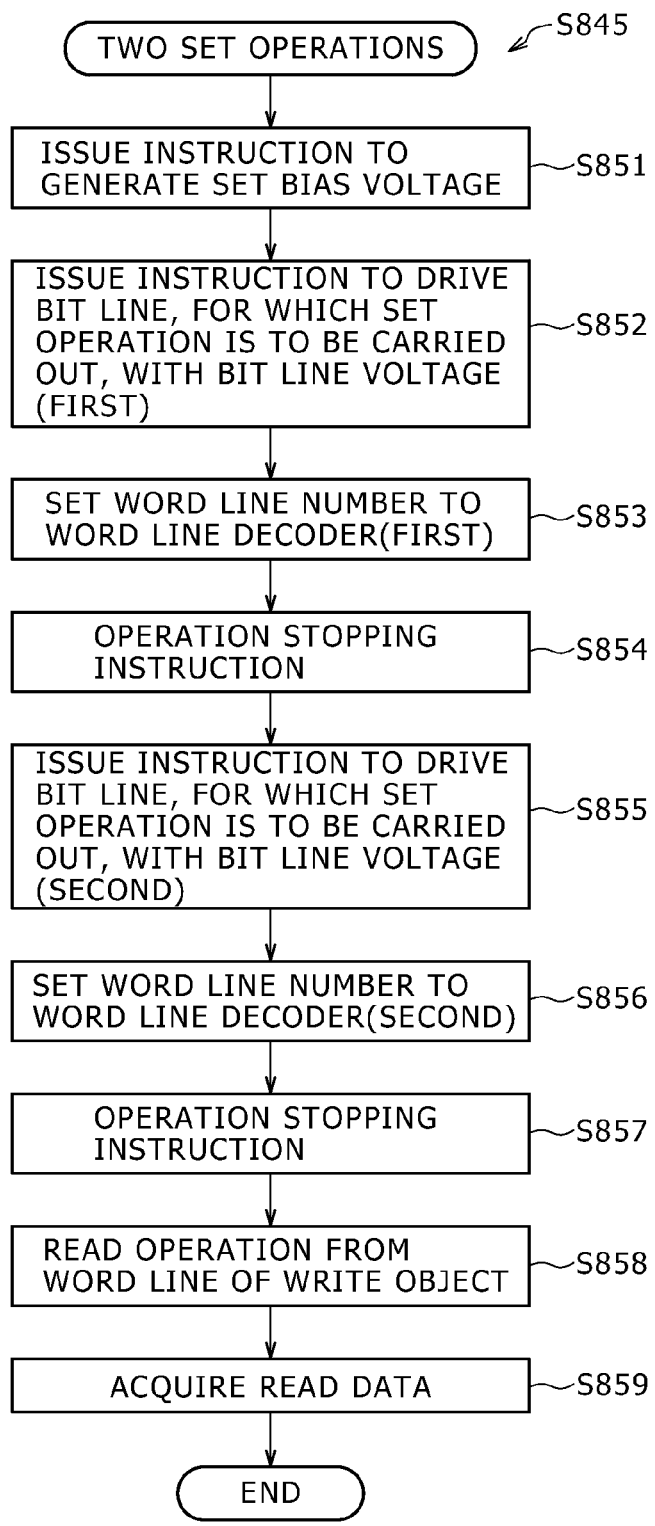
FIG. 13 is a flow chart illustrating an example of a processing procedure of two set operations in the processing procedure illustrated in FIG. 12.

FIG. 13 illustrates an example of a processing procedure of the two set operations in the first embodiment of the present technology, namely, at step S845 of FIG. 12.

The control section 130 instructs the driver 160 to generate a voltage bias for a set operation at step S851 similarly as at step S931 in the operation of the set operation described hereinabove with reference to FIG. 9. In particular, the control section 130 sets the plate voltage to become a potential of "+Vset" with respect to the bit line voltage. The plate of the memory cell array 110 is driven with the plate voltage supplied from the driver 160.

The control section 130 provides a bit pattern to be used for a set operation corresponding to the first write command to the bit line selector 150 similarly as at step S932 in the operation of the set operation described hereinabove with reference to FIG. 9. Then, the control section 130 instructs the bit line selector 150 to drive those bit lines which correspond to the value "1" with the bit line voltage and drive those bit lines which correspond to the value "0" with the plate voltage at step S852. The bit line selector 150 supplies the bit line voltage or the plate voltage supplied thereto from the driver 160 in accordance with the instruction from the control section 130.

The control section 130 sets the word line number designated by the first write command, here, WL_3, to the word line decoder 140 at step S853 similarly as at step S933 in the operation of the set operation described hereinabove with reference to FIG. 9. Consequently, a set operation corresponding to the first write command is carried out.

The control section 130 cancels the setting of the word line number to the word line decoder 140 and cancels the driving instruction of the bit lines to the bit line selector 150 at step S854. It is to be noted that, although the timing of the completion of the setting operation may be determined by a clock which the control section 130 or the like has internally, detailed description of the same is omitted herein.

The control section 130 provides a bit pattern to be used for a set operation corresponding to the second write command to the bit line selector 150 similarly as at step S932 in the operation of the set operation described hereinabove with reference to FIG. 9. Then, the control section 130 instructs the bit line selector 150 to drive those bit lines which correspond to the value "1" with the bit line voltage and drive those bit lines which correspond to the value "0" with the plate voltage at step S855. The bit line selector 150 supplies the bit line voltage or the plate voltage supplied thereto from the driver 160 in accordance with the instruction from the control section 130.

The control section 130 sets the word line number designated by the second write command, here, WL_6, to the word line decoder 140 at step S856 similarly as at step S933 in the operation of the set operation described hereinabove with reference to FIG. 9. Consequently, a set operation corresponding to the second write command is carried out.

The control section 130 cancels the setting of the word line number to the word line decoder 140 and cancels the driving instruction of the bit line to the bit line selector 150 at step S857. Further, the control section 130 instructs the driver 160 to stop the generation of the voltage bias. It is to be noted that, although the timing of the completion of the set operation may be determined by a clock which the control section 130 or the like has internally, detailed description of the same is omitted herein.

The control section 130 reads out the values recorded at present at the bits corresponding to the designated word lines numbers, here, WL_3 and WL_6, at step S858 similarly as at step S938 in the operation of the set operation described hereinabove with reference to FIG. 9. Then, the control section 130 accesses the bit line selector 150 to acquire the data read out from the memory cell array 110 at step S859 similarly as at step S939 in the operation of the set operation described hereinabove with reference to FIG. 9.

It is to be noted that, if it is decided at step S846 that the setting has not been carried out normally, then in the set operation in the second or later operation cycle, only those bits with regard to which the set operation has not been carried out normally are determined as a set operation object. Therefore, it seems a possible idea to skip the set operation corresponding to the first write command at step S852 and S853 or the set operation corresponding to the second write command at step S855 and S856.

Figure 14:
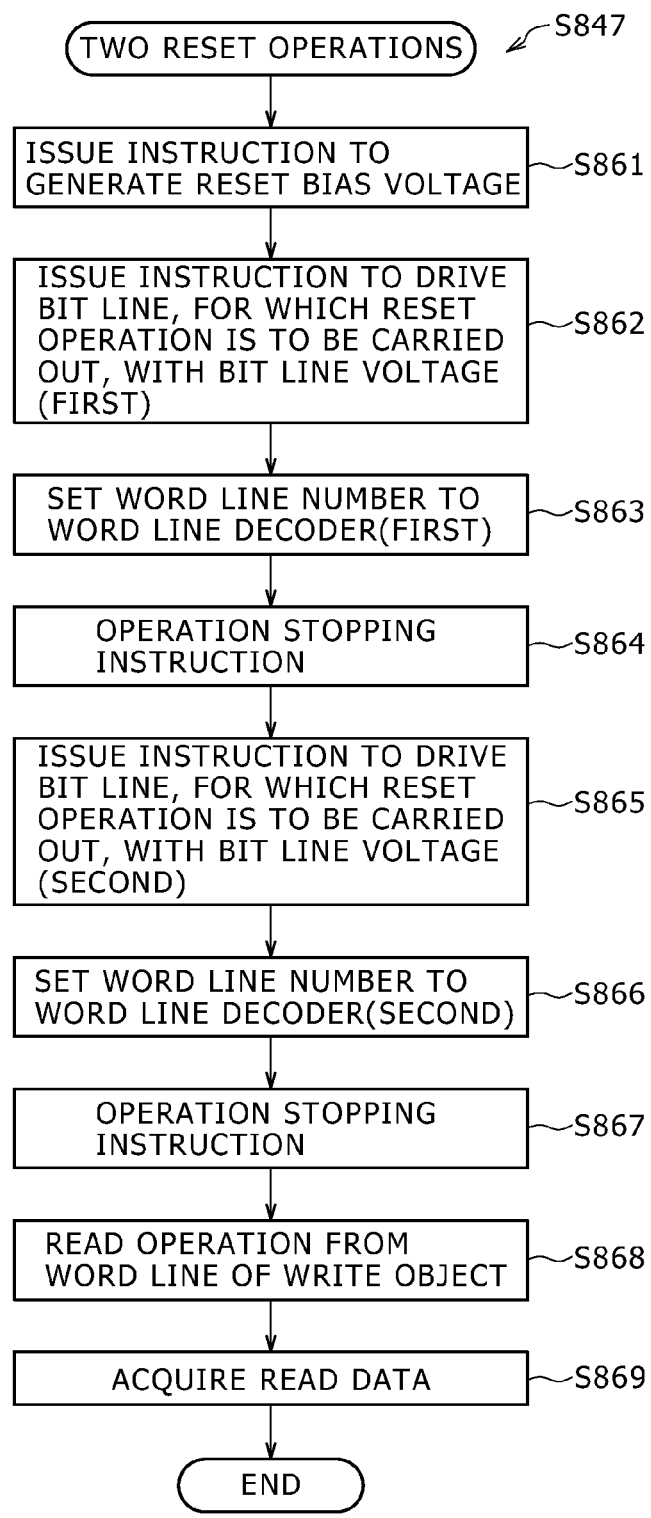
FIG. 14 is a flow chart illustrating an example of a processing procedure of two reset operations in the processing procedure illustrated in FIG. 12.

FIG. 14 illustrates an example of a processing procedure of the two reset operations in the first embodiment of the present technology, namely, at step S847 of FIG. 12.

The control section 130 instructs the driver 160 to generate a voltage bias for a reset operation at step S861 similarly as at step S941 in the operation of the reset operation described hereinabove with reference to FIG. 10. In particular, the control section 130 carries out setting such that the bit line voltage becomes "+Vreset" with respect to the plate voltage. The plate 113 of the memory cell array 110 is driven with the plate voltage supplied from the driver 160.

The control section 130 provides a cell pattern to be used for a reset operation corresponding to the first write command to the bit line selector 150 similarly as at step S942 in the operation of the reset operation described hereinabove with reference to FIG. 10. Then, the control section 130 issues an instruction to drive those bit lines corresponding to the value "1" with the bit line voltage and drive those bit lines corresponding to the value "0" with the plate voltage at step S862. The bit line selector 150 supplies the bit line voltage or the plate voltage supplied from the driver 160 in accordance with the instruction from the control section 130.

The control section 130 sets the word line number designated by the first write command, here, WL_3, to the word line decoder 140 at step S863 similarly as at step S943 in the operation of the reset operation described hereinabove with reference to FIG. 10. Consequently, a reset operation corresponding to the first write command is carried out.

The control section 130 cancels the setting of the word line number to the word line decoder 140 and cancels the driving instruction of the bit line to the bit line selector 150 at step S864. It is to be noted that, although the timing of the completion of the reset operation may be determined by a clock which the control section 130 has internally, detailed description of the same is omitted herein.

The control section 130 provides a cell pattern to be used for a reset operation corresponding to the second write command to the bit line selector 150 similarly as at step S942 in the operation of the reset operation described hereinabove with reference to FIG. 10. Then, the control section 130 issues an instruction to drive those bit lines which correspond to the value "1" with the bit line voltage and drive those bit lines which correspond to the value "0" with the plate voltage at step S865. The bit line selector 150 supplies the bit line voltage or the plate voltage supplied from the driver 160 in accordance with the instruction from the control section 130.

The control section 130 sets the word line number designated by the second write command, here, WL_6, to the word line decoder 140 at step S866 similarly as at step S943 in the operation of the reset operation described hereinabove with reference to FIG. 10. Consequently, a reset operation corresponding to the second write command is carried out.

The control section 130 issues an operation stopping instruction at step S867 similarly as at step S944 in the operation of the reset operation described hereinabove with reference to FIG. 10. In particular, the control section 130 cancels the setting of the word line number to the word line decoder 140, cancels the driving instruction for the bit lines to the bit line selector 150 and instructs the driver 160 to stop the generation of the voltage bias. It is to be noted that, although the timing of the completion of the reset operation may be determined by a clock which the control section 130 or the like has internally detailed description of the same is omitted herein.

The control section 130 reads out the values recorded at present at the bits corresponding to the designated word line numbers, here, WL_3 and WL_6, at step S868 similarly as at step S948 in the operation of the reset operation described hereinabove with reference to FIG. 10. Then, the control section 130 accesses the bit line selector 150 to acquire the data read out from the memory cell array 110 at step S869 similarly as at step S949 in the operation of the reset operation described hereinabove with reference to FIG. 10.

It is to be noted that, if it is decided at step S948 that the reset operation has not been carried out normally, then in the reset operation for the second time, only those bits with regard to which it is found that the reset operation has not been carried out normally are determined as a reset operation object. Therefore, it seems a possible idea to skip the reset operation corresponding to the first write command at step S862 and S863 or the reset operation corresponding to the second write command at step S865 and S866.

Figure 15:
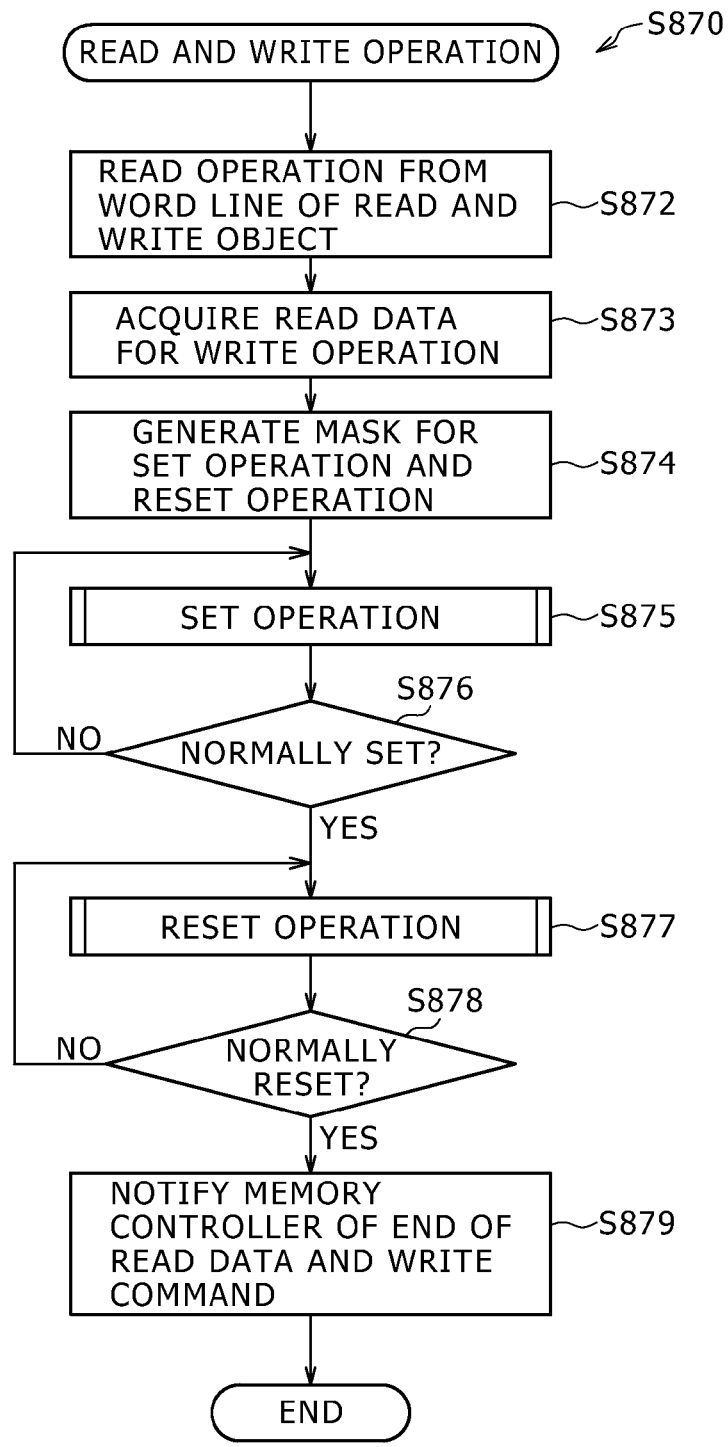
FIG. 15 is a flow chart illustrating an example of a processing procedure of one read operation and one write operation in the processing procedure illustrated in FIG. 6.

FIG. 15 illustrates an example of a processing procedure of one read operation and one write operation in the first embodiment of the present technology, namely, at step S870 illustrated in FIG. 6. In the following, it is assumed that the blocks of one read command and one write command placed in the command queue 131 are the block 101, and the word line number of the read command is WL_3 and the word line number of the write command is WL_6.

The control section 130 carries out operations similar to those at steps S832 to S836 illustrated in FIG. 11 to read out the values recorded at present in the bits corresponding to the two word line numbers designated by the read command and the write command, here, WL_3 and WL_6, at step S872. The operation at step S872 is similar to the two read operations at step S830 described hereinabove with reference to FIG. 11. In particular, for example, the control section 130 carries out a read operation for the read command at step S834 and a read operation for the write command at step S835. Consequently, application of the voltage bias for the read operation in the read command and the write command can be carried out collectively.

The control section 130 accesses the bit line selector 150 similarly as at step S923 in the operation of the write command described hereinabove with reference to FIG. 8. Consequently, the control section 130 acquires data corresponding to the read command and the write command read out from the memory cell array 110 at step S873. The processing for the read command is completed herewith, and thereafter, processing for the write command is carried out.

The control section 130 compares the data read out from the memory cell array 110 and the data for writing with each other similarly as at step S924 in the operation of the write command described hereinabove with reference to FIG. 8. Then, the control section 130 determines a set mask indicative of bits for which a setting operation is to be carried out and a reset mask indicative of bits for which a reset operation is to be carried out at step S874.

The control section 130 carries out a set operation at step S875 and repeats the set operation until it is decided at step S876 that the setting operation has been carried out normally. The execution processing procedure of the set operation at step S875 is similar to the process at step S925 described hereinabove with reference to FIG. 9. In particular, at step S876, the control section 130 compares the read out data and the bit pattern to be used for a set operation to confirm whether or not the set operation has been carried out normally. It is to be noted that, in the set operation in the second or later operation cycle, only those bits with regard to which it is found that the set operation has not been carried out normally at step S876 are determined as a set operation object. Further, in order to determine an upper limit to the number of times by which a set operation is to be retried by a reading operation following a set operation, a counter may be provided such that a failure in retry by more than the prescribed number of times is determined as an error. However, description of this technique is omitted herein.

The control section 130 carries out a reset operation at step S877 and repeats the reset operation until it is found at step S878 that the reset operation has been carried out normally. The execution processing procedure of the reset operation at step S877 is similar to the process at step S927 described hereinabove with reference to FIG. 10. In particular, at step S878, the control section 130 compares the read out data and the bit pattern to be used for a reset operation to confirm whether or not the reset operation has been carried out normally. It is to be noted that, in the reset operation in the second or later operation cycle, only those bits with regard to which it is found that the reset operation has not been carried out normally at step S878 are determined as a reset operation object. Further, in order to determine an upper limit to the number of times by which a reset operation is to be retried by a reading operation following a reset operation, a counter may be provided such that a failure in retry by more than the prescribed number of times is determined as an error. However, description of this technique is omitted herein.

After the processes described above are completed, the control section 130 instructs the controlling interface 120 to notify the memory controller 200 of the data read out corresponding to the read command and the end of the write command at step S879. It is to be noted that the data read out corresponding to the read command may be conveyed to the memory controller 200 at step S873.

In this manner, in the first embodiment of the present technology, from among operations in processes of a plurality of commands for words different from each other in the same one of blocks having a common plate in a resistance change memory, those operations wherein an equal voltage is applied as a drive voltage are executed collectively and successively. In particular, when two read commands are to be executed, two read operations are executed collectively and successively. When two write commands are to be executed, two read operations for pre-reading, two set operations, two read operations for verification, two reset operations and two read operations for verification are individually executed collectively and successively. When one read command and one write command are to be executed, a read operation of the read command and a read operation for pre-reading of the write command are executed collectively and successively. Consequently, generation of charging and discharging involved in a variation of the drive voltage can be suppressed to reduce the power consumption.

Modification

In the first embodiment described above, in the case where two commands for different words in the same block are a combination of a read command and a write command, read operations in the two commands are collectively executed. However, the two operations may be executed successively.

Figure 16:
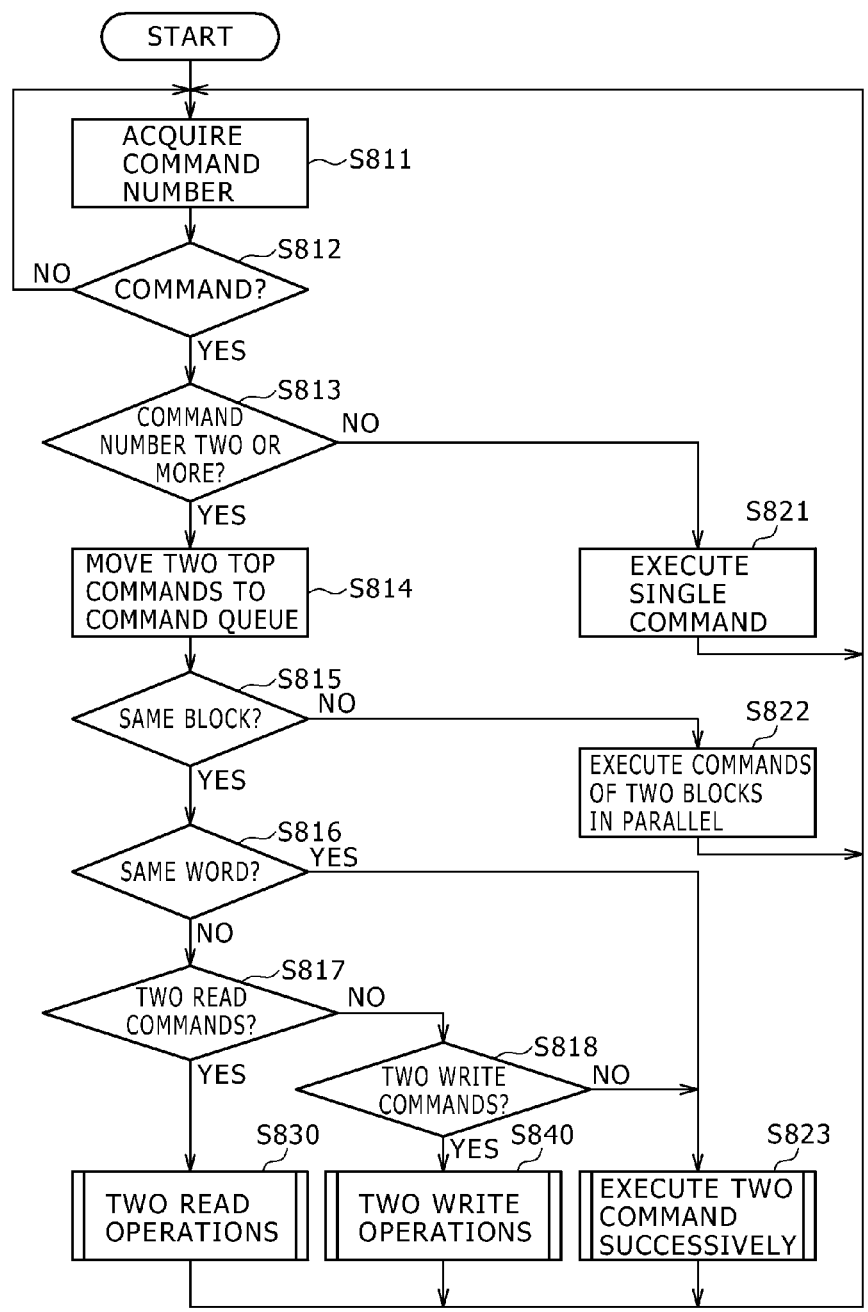
FIG. 16 is a flow chart illustrating an example of a processing procedure of the memory according to a modification to the first embodiment of the present technology.

FIG. 16 illustrates an example of a processing procedure of the memory 100 in a modification to the first embodiment of the present technology. Referring to FIG. 16, in the modification illustrated, if two commands for different words in the same block are a combination of a read command and a write command at step S818, namely, if the decision at step S818 is No, then the read command and the write command are executed successively at step S823. This is equivalent to a manner of handling similar to that in a case in which the two commands are for the same word in the same block. By this handling, an effect by the collection of read operations is not obtained. However, the cumbersomeness in collecting commands of different types can be eliminated, and simplification and speedup of control can be anticipated.

2. Second Embodiment

While the first embodiment described above assumed a write command for executing a set operation and a reset operation by one command, the set operation and the reset operation may be executed by individual commands. A second embodiment is described assuming an erasure command for carrying out only a set operation without carrying out a reset operation and a program command for carrying out only a reset operation without carrying out a set operation. It is to be noted that, while it is assumed here that the erasure command and the program command are provided in place of the write command, the write command may be used together. Further, since the entire configuration as the information processing system and the configuration of the memory 100 are similar to those of the first embodiment described above, description of them is omitted in the following description.

Figure 17:
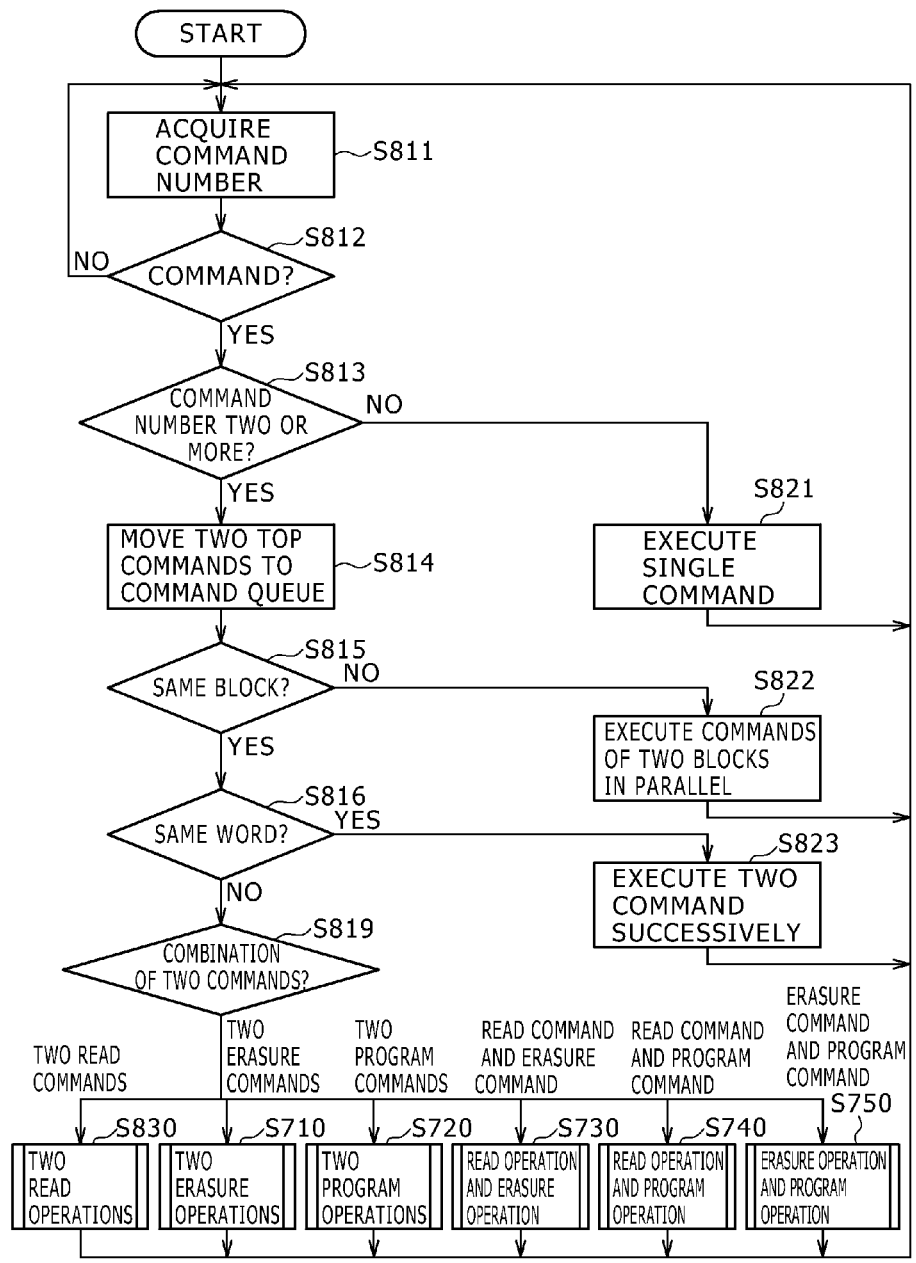
FIG. 17 is a flow chart illustrating a processing procedure of a memory according to a second embodiment of the present technology.

FIG. 17 illustrates an example of a processing procedure of the memory 100 in the second embodiment of the present technology. The memory controller 200 configures a command group formed from a read command, an erasure command, a program command or a combination of the commands in accordance with an instruction from the host computer 300 and writes the command group into the controlling interface 120 of the memory 100. The erasure command is used to change a bit of the logical value "1" so as to have the logical value "0" by the set operation. The program command is used to change a bit of the logical value "0" so as to have the logical value "1" by the reset operation.

Referring to FIG. 17, in the second embodiment, a process at step S819 at which a combination of two commands is decided is executed in place of the processes at steps S817 and S818 of FIG. 6 in the first embodiment. The processing procedure at the steps preceding to step S819 is similar to that of the first embodiment.

At step S819, a combination of two commands which access words different from each other in the same block is decided. If the two commands are two read commands, then a process at step S830 is executed. The process at step S830 is similar to that of the processing procedure of FIG. 11 in the first embodiment. If the two commands are two erasure commands, then the process at step S710 is executed. If the two commands are two program commands, then the process at step S720 is executed. If the two commands are a read command and an erasure command, then the process at step S730 is executed. If the two commands are a read command and a program command, then the process at step S740 is executed. If the two commands are an erasure command and a program command, then the process at step S750 is executed. After one of the processes just described is executed, the processing returns to step S811 and the operations are carried out repetitively.

Figure 18:
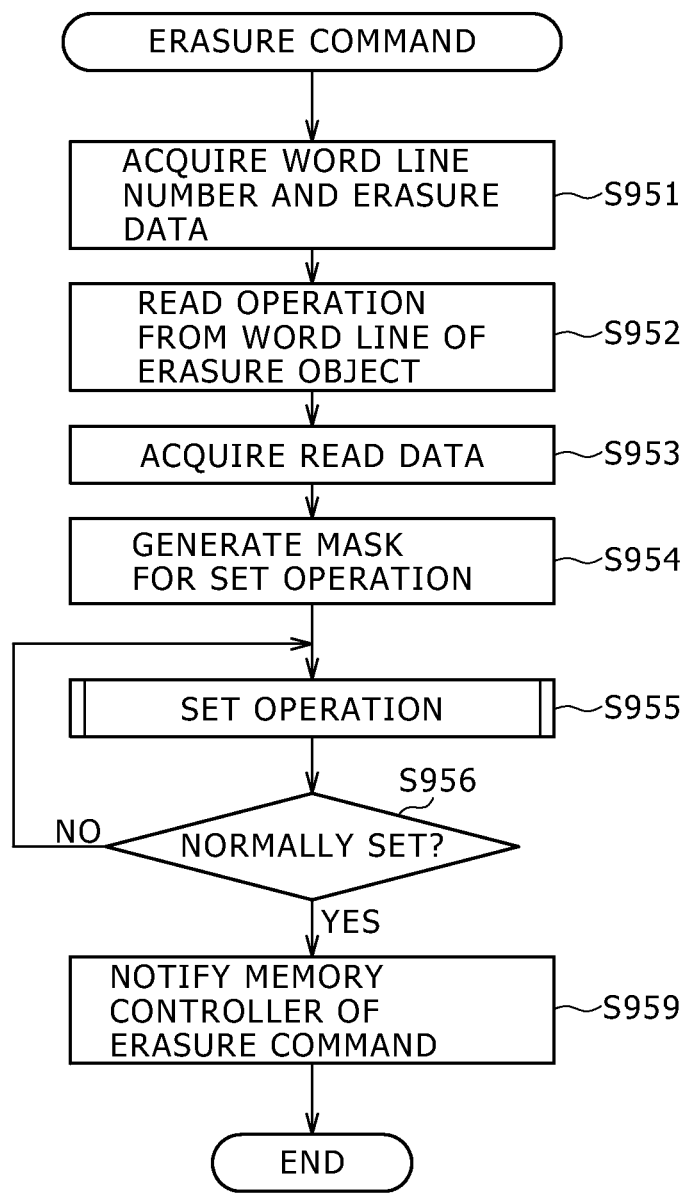
FIG. 18 is a flow chart illustrating an example of a processing procedure of one erasure command in the second embodiment of the present technology.

FIG. 18 is a flow chart illustrating an example of a processing procedure of one erasure command in the second embodiment of the present technology. The process of the erasure command is executed at step S821, S822 or S823 of FIG. 17 in place of the write command described in the first embodiment. The process of the erasure command is similar to a process configured by removing the reset operation (steps S927 and S928) from the process of the write command of FIG. 8 in the first embodiment. A processing procedure of the set operation at step S955 is similar to that of FIG. 9 in the first embodiment.

Figure 19:
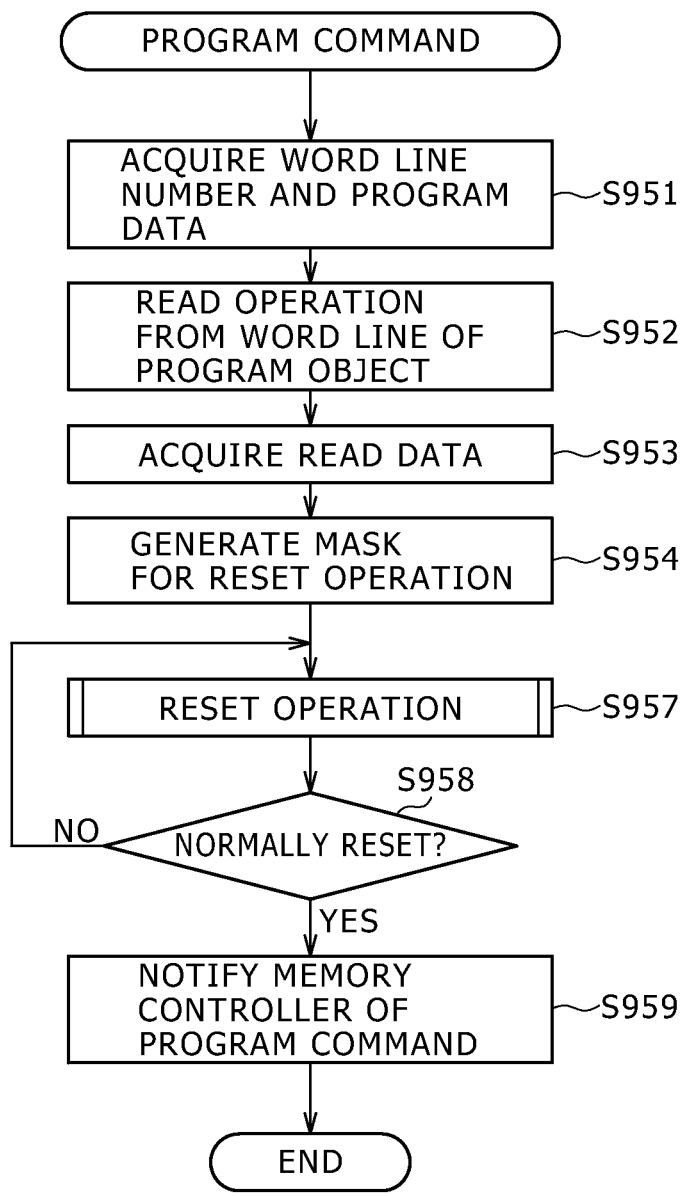
FIG. 19 is a flow chart illustrating an example of a processing procedure of one program command in the second embodiment of the present technology.

FIG. 19 is a flow chart illustrating an example of a processing procedure of one program command in the second embodiment of the present technology. The process of the program command is executed at step S821, S822 or S823 of FIG. 17 in place of the write command described in the first embodiment. The process of the program command is similar to a process configured by removing the set operation (steps S925 and S926) from the process of the write command of FIG. 8 in the first embodiment. A processing procedure of the reset operation at step S967 is similar to that of FIG. 10 in the first embodiment.

Figure 20:
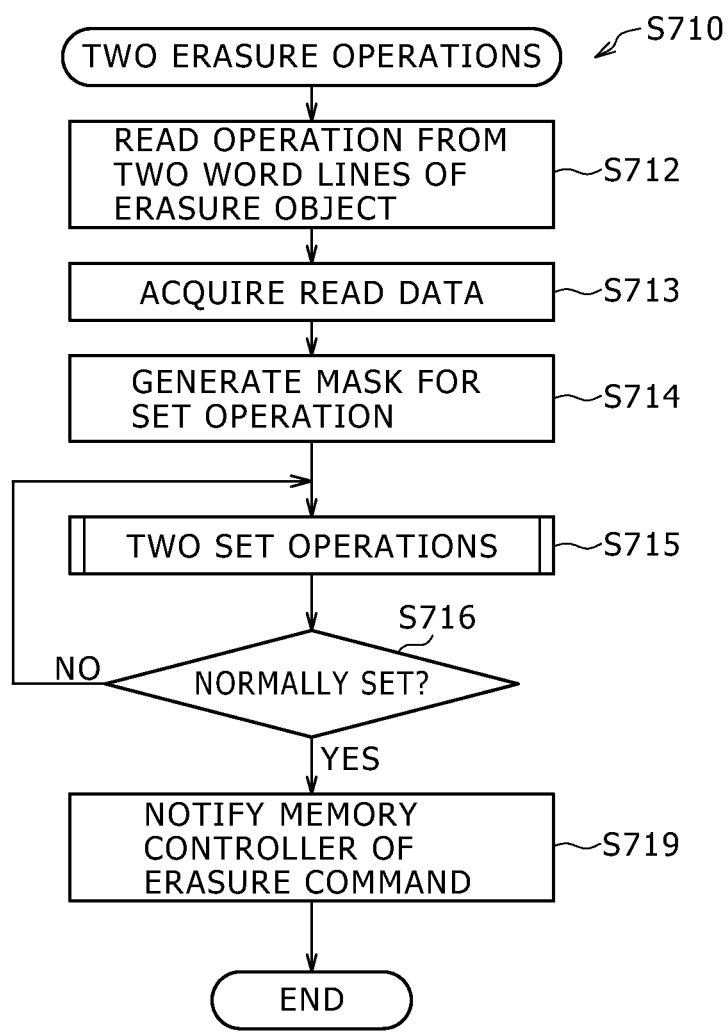
FIG. 20 is a flow chart illustrating a processing procedure of two erasure operations in the processing procedure of FIG. 17.

FIG. 20 is a flow chart illustrating an example of a processing procedure of two erasure operations at step S710 in the second embodiment of the present technology. The process of the two erasure operations is executed at step S710 of FIG. 17. The process of the two erasure operations is similar to a process configured by removing two reset operations at steps S847 and S848 from the process of the two write operation of FIG. 12 in the first embodiment. A processing procedure of the two set operations at step S715 is similar to that of FIG. 13 in the first embodiment.

Figure 21:
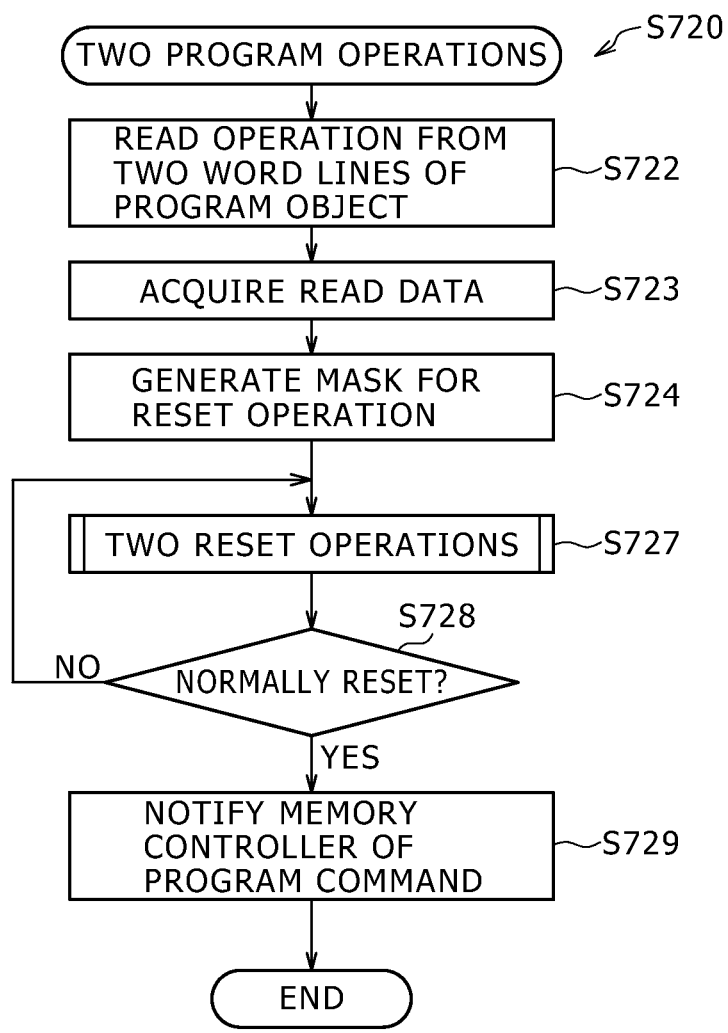
FIG. 21 is a flow chart illustrating a processing procedure of two program operations in the processing procedure of FIG. 17.

FIG. 21 is a flow chart illustrating an example of a processing procedure of two program operations at step S720 in the second embodiment of the present technology. The process of the two program operations is executed at step S720 of FIG. 17. The process of the two program operations is similar to a process configured by removing the two set operations at steps S845 and S846 from the process of the two write operations of FIG. 12 in the first embodiment. A processing procedure of the two reset operations at step S727 is similar to that of FIG. 14 in the first embodiment.

Figure 22:
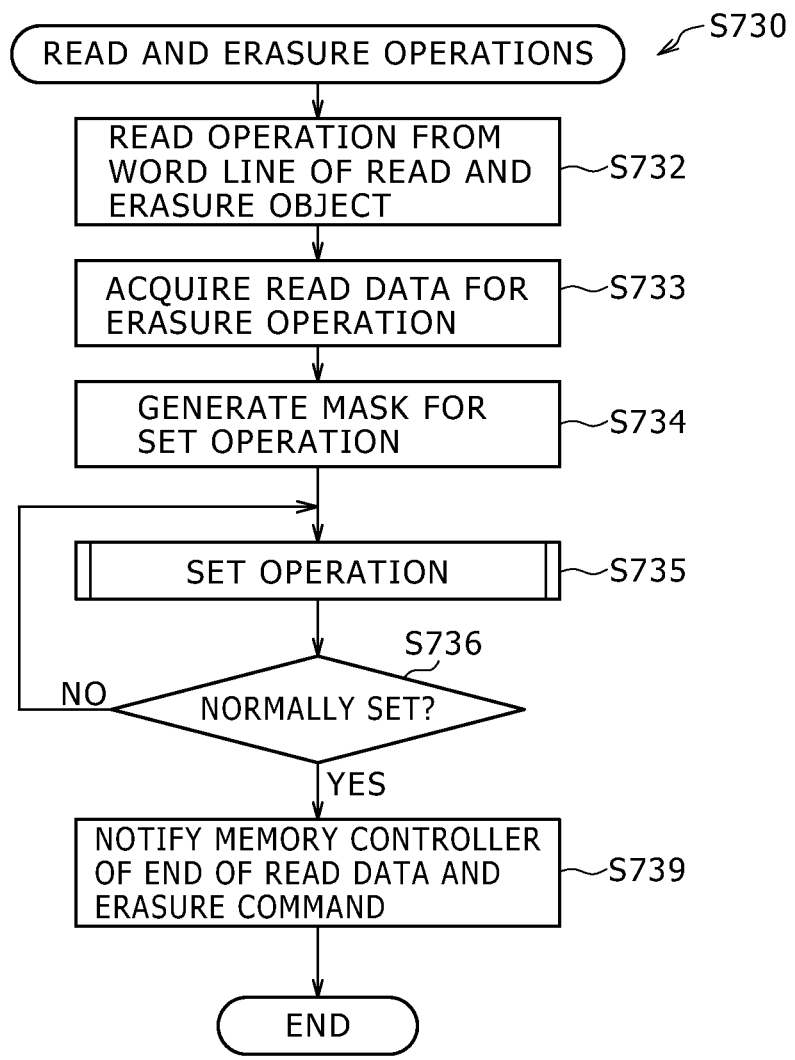
FIG. 22 is a flow chart illustrating a processing procedure of one read operation and one erasure operation in the processing procedure of FIG. 17.

FIG. 22 is a flow chart illustrating an example of a processing procedure of one read operation and one erasure operation at step S730 in the second embodiment of the present technology. The process of the one read operation and one erasure operation is executed at step S730 of FIG. 17. The process of the one read operation and one erasure operation is similar to a process configured by removing the reset operation at step S877 and S878 from the process of the one read operation and one write operation of FIG. 15 in the first embodiment. A processing procedure of the set operation at step S735 is similar to that of FIG. 9 in the first embodiment.

Figure 23:
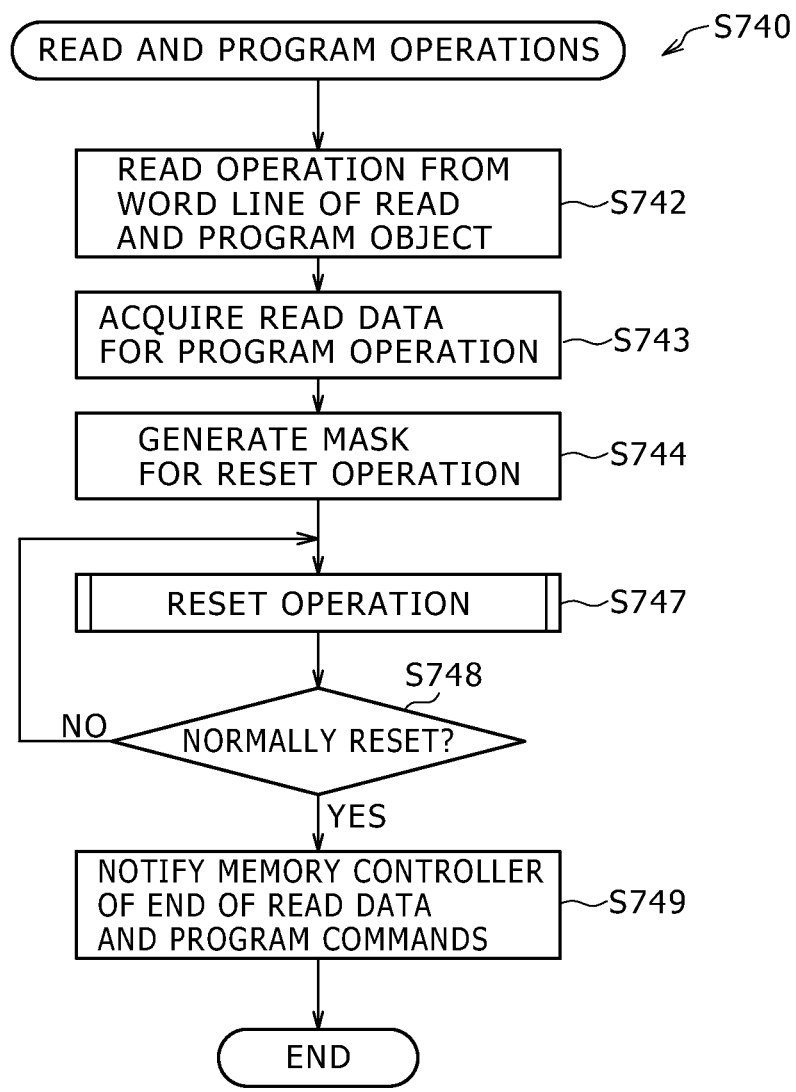
FIG. 23 is a flow chart illustrating a processing procedure of one read operation and one program operation in the processing procedure of FIG. 17.

FIG. 23 is a flow chart illustrating an example of a processing procedure of one read operation and one program operation at step S740 in the second embodiment of the present technology. The process of the one read operation and one program operation is executed at step S740 of FIG. 17. The process of the one read operation and one program operation is similar to a process configured by removing the set operation a steps S875 and S876 from the process of the one read operation and one write operation of FIG. 15 in the first embodiment. A processing procedure of the reset operation at step S747 is similar to that of FIG. 10 in the first embodiment.

Figure 24:
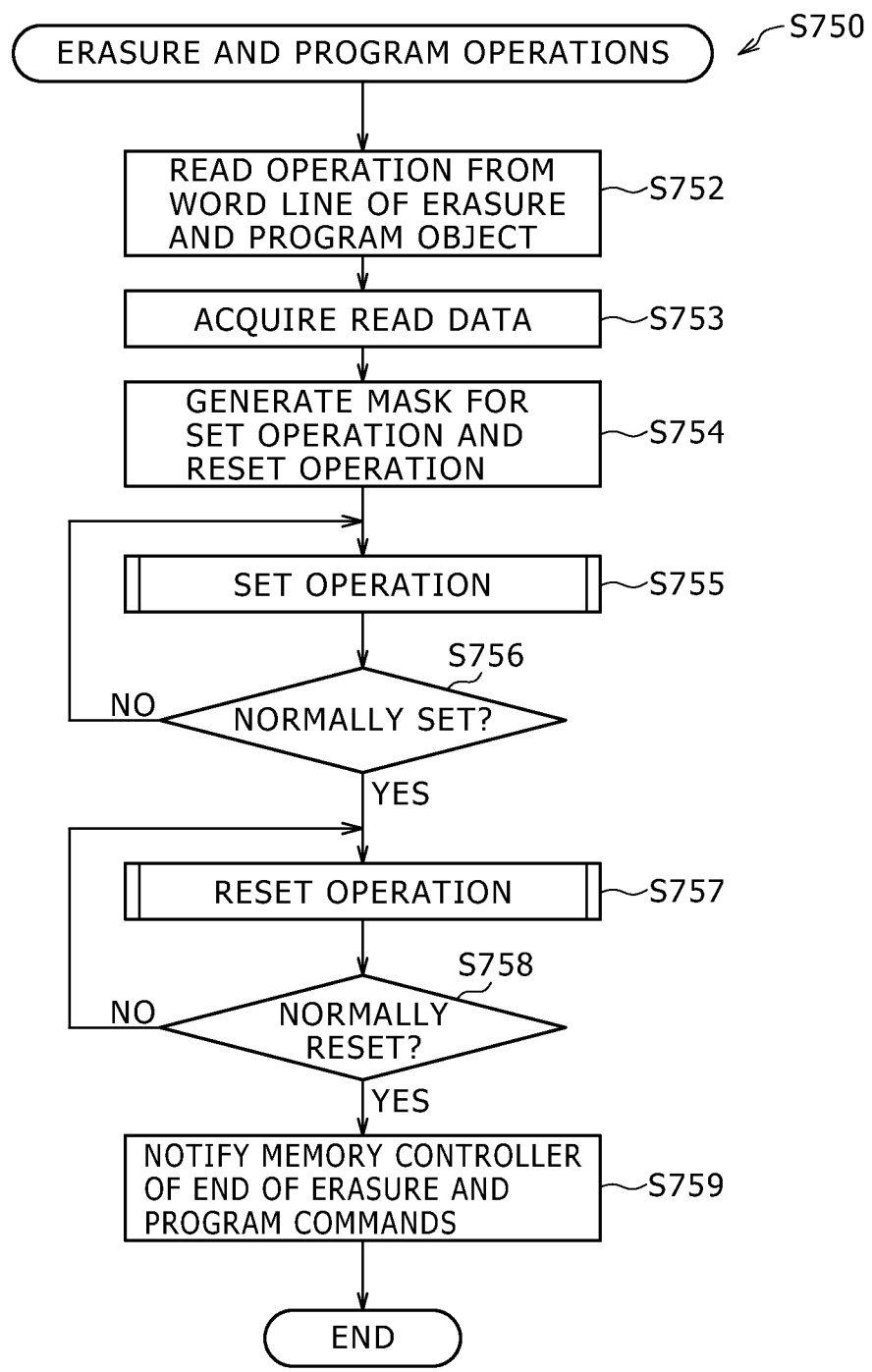
FIG. 24 is a flow chart illustrating a processing procedure of one erasure operation and one program operation in the processing procedure of FIG. 17.

FIG. 24 is a flow chart illustrating a processing procedure of one erasure operation and one program operation at step S750 in the second embodiment of the present technology. The process of the one erasure operation and one program operation is executed at step S750 of FIG. 17. The process of the one erasure operation and one program operation conforms to the process of the one read operation and one write operation of FIG. 15 in the first embodiment. In particular, the set operation for the erasure operation is executed at step S755 and the reset operation for the program operation is executed at step S757. A processing procedure of the set operation at step S755 is similar to that of FIG. 9 in the first embodiment. A processing procedure of the reset operation at step S757 is similar to that of FIG. 10 in the first embodiment.

In the second embodiment of the present technology, operations for applying voltages equal to each other as the drive voltage are collectively and successively executed assuming an erasure command and a program command in this manner. In particular, when two erasure commands are executed, two read operations for pre-reading, two set operations and two read operations for verification are individually executed collectively and successively. When two program commands are executed, two read operations for pre-reading, two reset operations, and two read operations for verification are collectively and successively executed. When one read command and one erasure command are executed, a read operation for the read command and a read operation for pre-reading of the erasure command are collectively and successively executed. When one read command and one program command are executed, a read operation for the read command and a read operation for pre-reading of the program command are collectively and successively executed. When one erasure command and one program command are executed, the two read operations for the pre-reading are collectively and successively executed. Consequently, occurrence of charging and discharging arising from variation of the drive voltage can be suppressed to reduce the power consumption.

It is to be noted that the embodiments described above are examples for implementing the present technology, and the items in the embodiments and the features in the claim have a corresponding relationship to each other. Similarly, the features in the claim and the items in the embodiments of the present technology to which the same names as the features are applied have a corresponding relationship to each other.

However, the present technology is not limited to the embodiments and can be implemented by applying various modifications to the embodiments without departing from the subject matter of the present technology.

Further, the processing procedures described in the embodiments described above may be considered as a method including series of procedures or may be considered as a program for causing a computer to execute the series of procedures or as a recording medium for storing the program therein. As the recording medium, for example, a CD (Compact Disc), an MD (Mini Disc), a DVD (Digital Versatile Disk), a memory card, a Blu-ray Disc (registered trademark) or the like can be used.

It is to be noted that the present technology can take such configurations as described below.

(1) A storage controlling apparatus, including:

a command decoder configured to decide whether or not a plurality of access object addresses of different commands included in a command string correspond to words different from each other in a same one of blocks of a memory cell array which have a common plate; and a command processing section configured to collectively and successively execute, when it is decided that the access object addresses of the commands correspond to the words different from each other in the same block of the memory cell array, those of operations in processing of the commands in which an equal voltage is applied as a drive voltage between the plate and a bit line.

(2) The storage controlling apparatus according to (1) above, wherein the command decoder further decides whether or not the commands are two read commands, and the command processing section collectively and successively executes, when it is decided that the access object addresses of the two read commands correspond to the words different from each other in the same block of the memory cell array, those of operations in processing of the two read commands in which a read drive voltage is applied as the drive voltage.

(3) The storage controlling apparatus according to (1) above, wherein the command decoder further decides whether or not the commands are two write commands, and the command processing section collectively and successively executes, when it is decided that the access object addresses of the two write commands correspond to the words different from each other in the same block of the memory cell array, those of operations in processing of the two write commands in which a read drive voltage is applied as the drive voltage, collectively and successively executes those operations in which a set drive voltage is applied as the drive voltage, and collectively and successively executes those operations in which a reset drive voltage is applied as the drive voltage.

(4) The storage controlling apparatus according to (1) above, wherein the command decoder further decides whether or not the commands are a combination of one read command and one write command, and the command processing section collectively and successively executes, when it is decided that the access object addresses of the read command and the write command correspond to words different from each other in the same block of the memory cell array, those of operations in processing of the read command and the write command in which a read drive voltage is applied as the drive voltage.

(5) The storage controlling apparatus according to (1) above, wherein the command decoder further decides whether or not the commands are two erasure commands, and the command processing section collectively and successively executes, when the access object addresses of the two erasure commands correspond to words different from each other in the same block of the memory cell array, those of operations in processing of the two erasure commands in which a read drive voltage is applied as the drive voltage, and collectively and successively executes those operations in which a set drive voltage is applied as the drive voltage.

(6) The storage controlling apparatus according to (1) above, wherein the command decoder further decides whether or not the commands are two program commands, and the command processing section collectively and successively executes, when it is decided that the access object addresses of the two program commands correspond to words different from each other in the same block of the memory cell array, those of operations in processing of the two program commands in which a read drive voltage is applied as the drive voltage, and collectively and successively executes those operations in which a reset drive voltage is applied as the drive voltage.

(7) The storage controlling apparatus according to (1) above, wherein the command decoder further decides whether or not the commands are a combination of one read command and one erasure command, and the command processing section collectively and successively executes, when it is decided that the access object addresses of the read command and the erasure command correspond to words different from each other in the same block of the memory cell array, those of operations of processing of the read command and the erasure command in which a read drive voltage is applied as the drive voltage from among operations.

(8) The storage controlling apparatus according to (1) above, wherein the command decoder further decides whether or not the commands are a combination of one read command and one program command, and the command processing section collectively and successively executes, when it is decided that the access object addresses of the read command and the program command correspond to words different from each other in the same block of the memory cell array, those of operations in processing of the read command and the program command in which a read drive voltage is applied as the drive voltage.

(9) The storage controlling apparatus according to (1) above, wherein the command decoder further decides whether or not the commands are a combination of one erasure command and one program command, and the command processing section collectively and successively executes, when it is decided that the access object addresses of the erasure command and the program command correspond to words different from each other in the same block of the memory cell array, those of operations in processing of the erasure command and the program command in which a read drive voltage is applied as the drive voltage.

(10) A storage apparatus, including:

a memory cell array configured from a plurality of divisional blocks which have a common plate;

a driver configured to supply a drive voltage between the plate and a bit line;

a command decoder configured to decide whether or not a plurality of access object addresses of different commands included in a command string correspond to words different from each other in the same block of the memory cell array; and a command processing section configured to collectively and successively execute, when it is decided that the access object addresses of the commands correspond to words different from each other in the same block of the memory cell array, those of operations in processing of the commands in which an equal voltage is applied as the drive voltage.

(11) The storage apparatus according to (10) above, wherein the memory cell array is a resistance change memory.

(12) A storage controlling method, including:

deciding whether or not a plurality of access object addresses of different commands included in a command string correspond to words different from each other in a same one of blocks of a memory cell array which have a common plate; and collectively and successively executing, when it is decided that the access object addresses of the commands correspond to words different from each other in the same block of the memory cell array, those of operations in processing of the commands in which an equal voltage is applied as a drive voltage between the plate and a bit line.

The present disclosure contains subject matter related to that disclosed in Japanese Priority Patent Application JP 2012-099330 filed in the Japan Patent Office on Apr. 25, 2012, the entire content of which is hereby incorporated by reference.

What is claimed is:

1. A storage controlling apparatus, comprising:
    a command decoder configured to decide whether or not a plurality of access object addresses of different commands included in a command string correspond to words different from each other in a same one of blocks of a memory cell array which have a common plate; and
    a command processing section configured to collectively and successively execute, when it is decided that the access object addresses of the commands correspond to the words different from each other in the same block of the memory cell array, those of operations in processing of the commands in which an equal voltage is applied as a drive voltage between the plate and a bit line.

2. The storage controlling apparatus according to claim 1, wherein the command decoder further decides whether or not the commands are two read commands, and
    the command processing section collectively and successively executes, when it is decided that the access object addresses of the two read commands correspond to the words different from each other in the same block of the memory cell array, those of operations in processing of the two read commands in which a read drive voltage is applied as the drive voltage.

3. The storage controlling apparatus according to claim 1, wherein the command decoder further decides whether or not the commands are two write commands, and
    the command processing section collectively and successively executes, when it is decided that the access object addresses of the two write commands correspond to the words different from each other in the same block of the memory cell array, those of operations in processing of the two write commands in which a read drive voltage is applied as the drive voltage, collectively and successively executes those operations in which a set drive voltage is applied as the drive voltage, and collectively and successively executes those operations in which a reset drive voltage is applied as the drive voltage.

4. The storage controlling apparatus according to claim 1, wherein the command decoder further decides whether or not the commands are a combination of one read command and one write command, and
    the command processing section collectively and successively executes, when it is decided that the access object addresses of the read command and the write command correspond to words different from each other in the same block of the memory cell array, those of operations in processing of the read command and the write command in which a read drive voltage is applied as the drive voltage.

5. The storage controlling apparatus according to claim 1, wherein the command decoder further decides whether or not the commands are two erasure commands, and
    the command processing section collectively and successively executes, when the access object addresses of the two erasure commands correspond to words different from each other in the same block of the memory cell array, those of operations in processing of the two erasure commands in which a read drive voltage is applied as the drive voltage, and collectively and successively executes those operations in which a set drive voltage is applied as the drive voltage.

6. The storage controlling apparatus according to claim 1, wherein the command decoder further decides whether or not the commands are two program commands, and
    the command processing section collectively and successively executes, when it is decided that the access object addresses of the two program commands correspond to words different from each other in the same block of the memory cell array, those of operations in processing of the two program commands in which a read drive voltage is applied as the drive voltage, and collectively and successively executes those operations in which a reset drive voltage is applied as the drive voltage.

7. The storage controlling apparatus according to claim 1, wherein the command decoder further decides whether or not the commands are a combination of one read command and one erasure command, and
    the command processing section collectively and successively executes, when it is decided that the access object addresses of the read command and the erasure command correspond to words different from each other in the same block of the memory cell array, those of operations of processing of the read command and the erasure command in which a read drive voltage is applied as the drive voltage from among operations.

8. The storage controlling apparatus according to claim 1, wherein the command decoder further decides whether or not the commands are a combination of one read command and one program command, and
    the command processing section collectively and successively executes, when it is decided that the access object addresses of the read command and the program command correspond to words different from each other in the same block of the memory cell array, those of operations in processing of the read command and the program command in which a read drive voltage is applied as the drive voltage.

9. The storage controlling apparatus according to claim 1, wherein the command decoder further decides whether or not the commands are a combination of one erasure command and one program command, and
    the command processing section collectively and successively executes, when it is decided that the access object addresses of the erasure command and the program command correspond to words different from each other in the same block of the memory cell array, those of operations in processing of the erasure command and the program command in which a read drive voltage is applied as the drive voltage.

10. A storage apparatus, comprising:
a memory cell array configured from a plurality of divisional blocks which have a common plate;
a driver configured to supply a drive voltage between the plate and a bit line;
a command decoder configured to decide whether or not a plurality of access object addresses of different commands included in a command string correspond to words different from each other in the same block of the memory cell array; and
a command processing section configured to collectively and successively execute, when it is decided that the access object addresses of the commands correspond to words different from each other in the same block of the memory cell array, those of operations in processing of the commands in which an equal voltage is applied as the drive voltage.

11. The storage apparatus according to claim 10, wherein the memory cell array is a resistance change memory.

12. A storage controlling method, comprising:
deciding whether or not a plurality of access object addresses of different commands included in a command string correspond to words different from each other in a same one of blocks of a memory cell array which have a common plate; and
collectively and successively executing, when it is decided that the access object addresses of the commands correspond to words different from each other in the same block of the memory cell array, those of operations in processing of the commands in which an equal voltage is applied as a drive voltage between the plate and a bit line.

* * * * *